(12) United States Patent
Sano et al.

(10) Patent No.: US 8,120,057 B2
(45) Date of Patent: Feb. 21, 2012

(54) SEMICONDUCTOR LIGHT EMITTING ELEMENT

(75) Inventors: Masahiko Sano, Anan (JP); Takahiko Sakamoto, Anan (JP); Keiji Emura, Naruto (JP); Katsuyoshi Kadan, Anan (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 13/155,045

(22) Filed: Jun. 7, 2011

(65) Prior Publication Data

US 2011/0233596 A1 Sep. 29, 2011

Related U.S. Application Data

(63) Continuation of application No. 12/068,019, filed on Jan. 31, 2008, now Pat. No. 7,982,236.

(30) Foreign Application Priority Data

Feb. 1, 2007 (JP) ................................. 2007-023568
Feb. 25, 2007 (JP) ................................. 2007-044801

(51) Int. Cl.
*H01L 51/40* (2006.01)
(52) U.S. Cl. ................................. 257/99; 257/E33.065
(58) Field of Classification Search ............ 257/98–100, 257/E33.063, E33.064, E33.065, E33.066
See application file for complete search history.

(56) References Cited

U.S. PATENT DOCUMENTS

| | | | |
|---|---|---|---|
| 4,874,957 A | 10/1989 | Sasaki et al. | |
| 5,972,731 A * | 10/1999 | Dutta | ............................. 438/39 |
| 5,977,566 A | 11/1999 | Okazaki et al. | |
| 6,121,635 A * | 9/2000 | Watanabe et al. | ............... 257/91 |
| 6,335,771 B1 | 1/2002 | Hiraishi | |
| 6,417,525 B1 | 7/2002 | Hata | |
| 6,984,799 B2 | 1/2006 | Kawaguchi et al. | |
| 7,009,218 B2 * | 3/2006 | Sugimoto et al. | ............... 257/99 |
| 7,112,825 B2 * | 9/2006 | Shakuda et al. | ................ 257/99 |
| 7,375,380 B2 | 5/2008 | Asahara et al. | |

(Continued)

FOREIGN PATENT DOCUMENTS

JP 8-250769 A 9/1996

(Continued)

OTHER PUBLICATIONS

Japanese Office Action dated Aug. 23, 2011 from JP Application No. 2006-320401.

(Continued)

*Primary Examiner* — Matthew W Such
*Assistant Examiner* — Ali Naraghi
(74) *Attorney, Agent, or Firm* — Birch, Stewart, Kolasch & Birch, LLP

(57) ABSTRACT

The present invention provides a light emitting element capable or realizing at least one of lower resistance, higher output, higher power efficiency (1 m/W), higher mass productivity and lower cost of the element using a light transmissive electrode for an electrode arranged exterior to the light emitting structure. A semiconductor light emitting element includes a light emitting section, a first electrode and a second electrode on a semiconductor structure including first and second conductive type semiconductor layers, the first and the second electrodes respectively including at least two layers of a first layer of a light transmissive conductive film conducting to the first and the second conductive type semiconductor and a second layer arranged so as to conduct with the first layer. First and second light transmissive insulating films are respectively arranged so as to overlap at least one part of the first and the second layers.

16 Claims, 12 Drawing Sheets

U.S. PATENT DOCUMENTS

| | | |
|---|---|---|
| 2002/0179918 A1 | 12/2002 | Sung et al. |
| 2004/0051107 A1* | 3/2004 | Nagahama et al. ............. 257/79 |
| 2005/0212002 A1 | 9/2005 | Sanga et al. |
| 2006/0011946 A1 | 1/2006 | Toda et al. |
| 2006/0273335 A1* | 12/2006 | Asahara et al. ................. 257/98 |

FOREIGN PATENT DOCUMENTS

| | | |
|---|---|---|
| JP | 9-129921 A | 5/1997 |
| JP | 10-173224 A | 6/1998 |
| JP | 2001-102631 A | 4/2001 |
| JP | 2002-190620 | 7/2002 |
| JP | 2002-353506 A | 12/2002 |
| JP | 2003-060236 A | 2/2003 |
| JP | 2003-124517 A | 4/2003 |
| JP | 2003-133590 A | 5/2003 |
| JP | 2003-224297 A | 8/2003 |
| JP | 2004-179347 A | 6/2004 |
| JP | 2005-191326 A | 7/2005 |
| JP | 2005-197289 A | 7/2005 |
| JP | 2005-317931 A | 11/2005 |
| JP | 2006-156590 | 6/2006 |
| WO | WO 98/42030 A1 | 9/1998 |

OTHER PUBLICATIONS

JP Office Action issued in JP Application No. 2007-023568 dated Aug. 23, 2011.

JP Office Action issued in JP Application No. 2007-023568 dated Aug. 23, 2011.

* cited by examiner

FIG. 11A
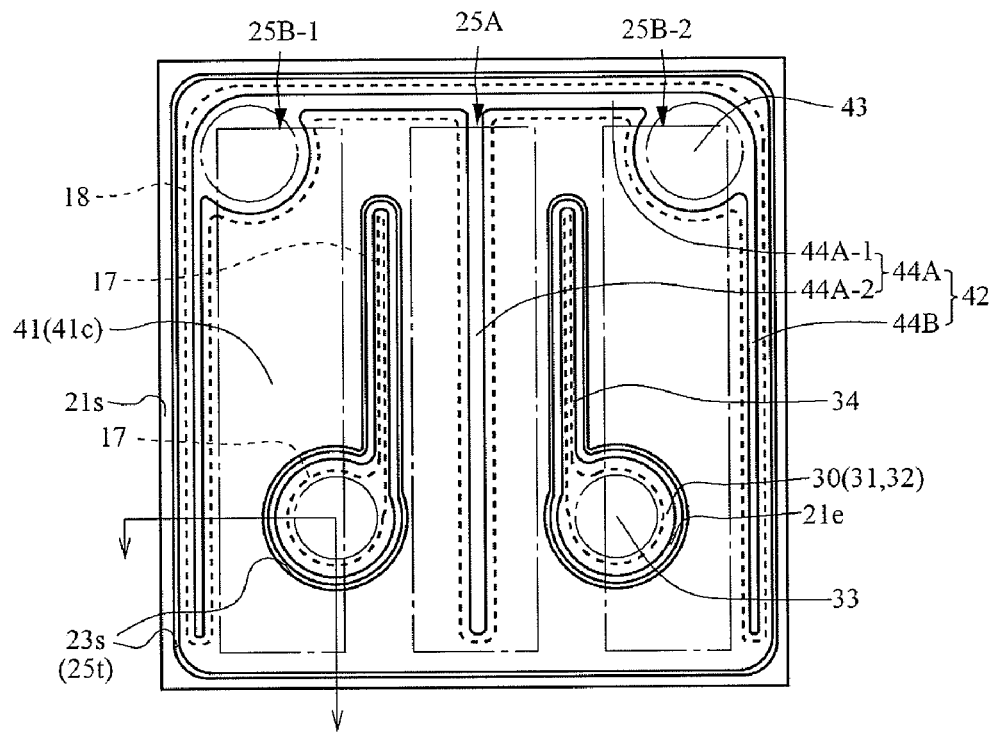
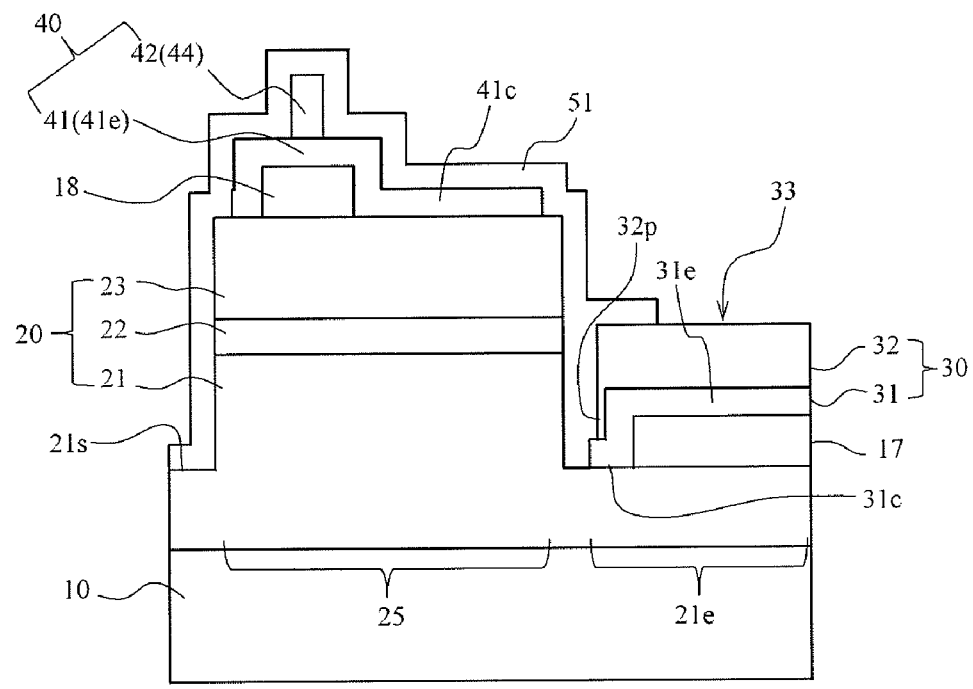
FIG. 11B

SEMICONDUCTOR LIGHT EMITTING ELEMENT

CROSS REFERENCE TO RELATED APPLICATIONS

This application is a Continuation of application Ser. No. 12/068,019 filed on Jan. 31, 2008 now U.S. Pat. No. 7,982,236, and for which priority is claimed under 35 USC §120, and which claims foreign priority to Application No. 2007-023568 filed in Japan, on Feb. 1, 2007, and Application No. 2007-044801 filed in Japan, on Feb. 25, 2007. The entire contents of all of the above applications are hereby incorporated by reference.

BACKGROUND OF THE INVENTION

The present invention relates to light emitting elements of a semiconductor, in particular, to an electrode structure of the light emitting element.

The light emitting element using a nitride semiconductor emits light in near-ultraviolet ray to red region due to the wide band gap characteristics thereof, and thus various researches are being carried out. A general basic structure of the nitride semiconductor light emitting element has a structure in which an n-type nitride semiconductor, an active layer, a p-type nitride semiconductor are stacked on a substrate, where each electrode is arranged in a p-layer and a partially exposed n-type layer, and research is being carried out on the light emitting structure including the electrode structure. In particular, various light emitting structures as well as electrode structures are being proposed in an aim of achieving high output.

Conventional proposals include, (1) using a transparent electrode such as ITO for the p electrode arranged on the light emitting structure, arranging a current blocking part of an insulating film at one part, and selectively light emitting the transparent electrode part as disclosed JP-H08-250769A, JP-H09-129921A, WO98-42030A, JP-H10-173224A;

(2) other structure for separating an external connecting part and a light emitting part as disclosed in JP-2003-124517A; and (3) a structure of arranging and overlapping a metal layer/reflection layer partially on the upper layer such as in JP-2003-124517A, or entirely on the upper layer such as in JP-2005-197289A, JP-2004-179347A, JP-2005-317931A for an electrode double-layer structure of n electrode and the like.

According to the conventional structure, in the structure of retrieving light in a region of transparent electrode, in particular, the sheet resistance of such electrode becomes high, where in such structure, an element resistance becomes high when adding a structure of selective light emitting/partial current blocking part, and light loss in a selective light emitting/current injecting part tends to increase, and furthermore, wall-plug efficiency (W.P.E) tends to lower. In application and general use to illumination application etc. of the semiconductor light emitting element, enhancement in high mass productivity, lower cost, light output, and power efficiency becomes necessary. In particular, power efficiency is sometimes a difficult demand since the element resistance such as Vf needs to be reduced, and light emitting characteristics and light retrieving efficiency must be enhanced.

In a conventional proposal from a different standpoint, the n electrode arranged in the n-type layer includes, (1) using a transparent electrode such as ITO as disclosed in JP-2003-060236A, JP-2005-317931A; and (2) a structure of overlapping and arranging a metal layer/reflection layer partially or entirely on the upper surface as disclosed in JP-2001-102631A, JP-2003-133590A, JP-2004-179347A, and JP-2005-317931.

Another further proposal includes suppressing the light shielding effect by lowering the height of the n electrode in JP-2001-102631A, enhancing the reflection effect by inclining the side surface of the n electrode in JP-2004-128321A, and the like with respect to the light emission from the active layer.

Here, the notation JP-[number]A refers to the Japanese Laid-Open Patent Publication number, and the notation WO[number]A refers to the International Publication number.

SUMMARY OF THE INVENTION

In the prior arts described above, the inventors have newly found that it is difficult to enhance light emitting characteristics and electrical properties, and that a great amount of light loss occurs with light reflection by the transparent electrode formed in the light retrieving region in the structure of light emission control by the external connecting part and light exit by the transparent electrode, and found based on such knowledge, that the light retrieving efficiency can be enhanced, and furthermore, the power efficiency can be enhanced by suitably controlling the light reflection in the light retrieving region and/or current injecting and light emitting region of the transparent electrode, and suppressing rise in the Vf element resistance.

The specific problems to be addressed of the present invention is to provide a light emitting element that realizes one of or preferably, most of lowering in resistance of the element, higher output, enhancement in light emitting efficiency (1 m/W) and wall-plug efficiency (W.P.E), higher mass productivity and lower cost using a light transmissive electrode for the electrode arranged outside the light emitting structure. The problem to be address in the embodiment of the present invention is to provide the light emitting element using the light transmissive electrode for the electrode arranged outside the light emitting structure.

According the semiconductor light emitting element according to first embodiment of the present invention, the light transmissive insulating film surface interposed in the second layer forming region is formed distant from the first layer surface in the current injecting region, the light emitting region, and the light extracting window region of the covered region of the first layer, whereby suitable light reflection, that is, reduction of light absorption by the light transmissive conductive film of the first layer in the covered region, and mainly, enhancement in light shielding property of metal etc., light reflection by the light transmissive insulating film in the second layer acting as light absorption can be achieved in each reflecting region.

According to the semiconductor light emitting element according to second embodiment of the present invention, with the light transmissive conductive film of the first layer of the covered region and the insulative protective film on the surface thereof, the film thickness of the light transmissive conductive film having a large light loss at the light reflection is made small as the light reflecting region at the boundary region with the semiconductor structure, a great amount of light is reflected by the insulative protective film, and in the light transmissive insulating film region of the second layer, the light reaching the light shielding electrode such as metal is reflected at the boundary region thereof, and suitable light reflecting region having low light loss is obtained by the insulating film of thick thickness.

Other embodiments according to the above-mentioned first and second embodiments preferably include the following embodiments.

According to one embodiment in which the light transmissive conductive film (first layer) of the covered region is formed thin or less than or equal to $\lambda/2n_1$, the exuding component of the light at the light reflecting region suppresses the light loss at the transparent conductive film having high extinction coefficient low, and the light quantity reaching the suitable light reflecting second layer of low light loss is reduced by the light transmissive insulating film having a film thickness of greater than or equal to and $\lambda/2n_2$ a low extinction coefficient. In one embodiment, the translucent light transmissive member having a low extinction coefficient is provided on the first layer surface of the covered region, most of the light exuding component in the light transmissive member having low light loss is light reflected by the light reflection at the covered region. The light reflection with reduced light loss is realized where the boundary region of light reflection with respect to the light inside the semiconductor structure is formed with the insulative protective film of the light transmissive member in the covered region and the light transmissive conductive film of the first layer.

In one embodiment, the insulating film surface is above the light transmissive member, the thick light transmissive insulating film under the second layer achieves a suitable light reflecting surface, in particular, total-reflection with the semiconductor structure, and suitable light retrieval is achieved by lowering the light reflectance by the thin protective film in the light retrieving window region. When the insulating film is arranged within a range of one wavelength ($\lambda/n_1$) or around ¼ wavelength thereof ($\lambda/n_1 \pm \lambda/2n_1$) serving as a light leakage region of light reflection at the reflecting region of the surface of the semiconductor structure, or the protective film at the surface thereof, the light loss is reduced, the light reflecting function is enhanced, and the reflectance is lowered with the film having low extinction coefficient. When the index of refraction $n_{1,2}$ of each film is smaller than the index of refraction $n_s$ of the semiconductor, or $n_s > n_{1,2}$, the light reflecting function can be enhanced.

With the covered region of the first layer as the light extracting window region, suitable light emitting structure excelling in light emitting characteristics and current diffusion property is obtained in an embodiment including an elongated part elongating from the external connecting part of the second layer for current diffusion, and furthermore, the current diffusion property can be enhanced, element resistance can be reduced, and suitable light retrieval can be realized in an embodiment the light transmissive insulating film is arranged at the elongated part of the second layer. In one embodiment the first layer extending on the light transmissive insulating film overlaps the second layer, the first layer and the second layer become conductive, whereby problems that occur when the second layer extends to the outside of the insulating film end and causes light loss can be solved, and furthermore, light loss can be suppressed low by arranging a light transmissive conductive film having high extinction coefficient on the insulating film on the outer side of the light reflection exuding region in light reflection.

In one embodiment of having a thin insulating film outer edge as a thin film, or having the vicinity of the end of the insulating film positioned near the boundary of the covered region (first layer) and the insulating film region (second layer) in the semiconductor structure plane as a thin film, the adherence of each film (first and second layers, protective film, and the like) bridged between the regions becomes satisfactory to act as an optically intermediate region of both regions, and suitable optical boundary is formed.

According to another embodiment including a thin protective film and a thick insulating film made of substantially the same material, or including a protective film and an insulating film which are made of substantially the same material and thickness and proposed over a interposed and a projected parts of the first layer, each function of the covered and insulating regions (first layer and second layer region) is suitably exhibited.

According to the semiconductor light emitting element of third embodiment of the present invention, the first layer of each electrode is extended to the outer side of the light transmissive insulating film, and the covered part and the second layer are overlapped to each other in the first electrode and separated from each other in the second electrode, so that a structure in which the light transmissive first layer of the covered part of the second electrode serves as the light extracting window part, and current is injected to the first layer electrode of the covered part of the first electrode is suitably realized.

According to the semiconductor light emitting element of fourth embodiment of the present invention, a second layer of the first electrode is arranged on the first conductive type semiconductor layer by way of the light transmissive insulating film, a light reflecting structure is arranged in an electrode forming region in a non-light emitting portion outside the light emitting structure portion, so that light is suitable reflected into the semiconductor structure, and the light transmissive first layer is conducted to the first conductive type semiconductor layer at a partial region of the electrode forming region, so that suitable current injection is realized.

In a semiconductor light emitting element of fifth embodiment of the present invention, the cross section or the area of the second layer projected part projected over the light transmissive first layer (covered part) conducting to each conductive type layer on the outer side of the light transmissive insulating film is larger in the second electrode than in the first electrode, and preferably, the number of first layer covered part and the second layer projected part is made larger in the second electrode than in the first electrode, and the first layer is interposed between the light transmissive insulating film and each conductive type semiconductor layer, so that each function of suitable current injection at the covered part and the projected part, suitable current spread at the interposed part, and suitable light reflection by the light transmissive insulating film thereon is provided, and the covered part and the projected part of the light emitting structure portion is made larger than the non-light emitting portion, so that a structure of retrieving light from the main surface side of the semiconductor structure facing the electrode forming surface side is suitably realized.

Other embodiments according to the above-mentioned embodiments preferably include the following embodiments.

In an embodiment including the covered part of the first layer on the outer side of the light transmissive insulating film, suitable current injection to the first conductive type layer is realized. In an embodiment the light transmissive insulating film is larger than the cross sectional width, the area, or the respective sum of the first layer covered part of the first electrode on the outer side, the light reflecting function is enhanced and suitable current injection is realized. In an embodiment including the first layer interposed part between the second layer and the insulating film in the first electrode, separation of the first layer by the insulating film is prevented, the first layer on both sides of the insulating film is suitably conducted at the interposed part, and evenness of the current is enhanced. In an embodiment the projected part of the second layer is arranged on the light emitting structure portion side and the first layer covered part exposed therefrom is arranged on the outer edge side, the sheet resistance component of the first layer is reduced, and suitable current injection from the projected part to the light emitting structure portion is realized. In an embodiment including a plurality of insulating films, an projected part of the second layer covering the same, and a covered part for connecting the same in the second electrode, a suitable light reflecting structure is realized on the electrode forming surface side, and suitable light retrieval from the semiconductor structure surface side facing thereto is realized. In an embodiment in which the covered part of the first and second electrodes have larger cross sectional width or larger area than the projected part thereof, most of the regions on the electrode forming surface side of the light emitting structure portion are covered by a plurality of light transmissive insulating films thereby enhancing the light reflecting function, an projected part conducting with the semiconductor at the opening between the insulating films is arranged, a covered part covering the insulating film is arranged, and an element including a second layer that becomes an excellent current injecting structure is obtained, and an element of suitable light reflecting structure is obtained. In an embodiment including a thick insulating film and a covered part of the first electrode first layer on the outer side thereof, a light transmissive insulating film having a lower index of refraction than the semiconductor structure is arranged, so that suitable light reflecting structure, in particular, light reflecting structure under the second layer is obtained.

In an embodiment including the covered part of the first layer on the outer side of the light transmissive insulating film, suitable current injection to the first conductive type layer is realized. In an embodiment the light transmissive insulating film is larger than the cross sectional width, the area, or the respective sum of the first layer covered part of the first electrode on the outer side, the light reflecting function is enhanced and suitable current injection is realized. In an embodiment including the first layer interposed part between the second layer and the insulating film in the first electrode, separation of the first layer by the insulating film is prevented, the first layer on both sides of the insulating film is suitably conducted at the interposed part, and evenness of the current is enhanced. In an embodiment the projected part of the second layer is arranged on the light emitting structure portion side and the first layer covered part exposed therefrom is arranged on the outer edge side, the sheet resistance component of the first layer is reduced, and suitable current injection from the projected part to the light emitting structure portion is realized. In an embodiment including a plurality of insulating films, an projected part of the second layer covering the same, and a covered part for connecting the same in the second electrode, a suitable light reflecting structure is realized on the electrode forming surface side, and suitable light retrieval from the semiconductor structure surface side facing thereto is realized. In an embodiment in which the covered part of the first and second electrodes have larger cross sectional width or larger area than the projected part thereof, most of the regions on the electrode forming surface side of the light emitting structure portion are covered by a plurality of light transmissive insulating films thereby enhancing the light reflecting function, an projected part conducting with the semiconductor at the opening between the insulating films is arranged, a covered part covering the insulating film is arranged, and an element including a second layer that becomes an excellent current injecting structure is obtained, and an element of suitable light reflecting structure is obtained. In an embodiment including a thick insulating film and a covered part of the first electrode first layer on the outer side thereof, a light transmissive insulating film having a lower index of refraction than the semiconductor structure is arranged, so that suitable light reflecting structure, in particular, light reflecting structure under the second layer is obtained.

BRIEF DESCRIPTION OF THE DRAWINGS

FIG. 11A is a schematic plan view of the light emitting element according to one embodiment of the present invention;

FIG. 11B is a schematic cross sectional view taken along line A-A of FIG. 11A;

DETAILED DESCRIPTION OF THE PREFERRED EMBODIMENTS

Figure 1A:
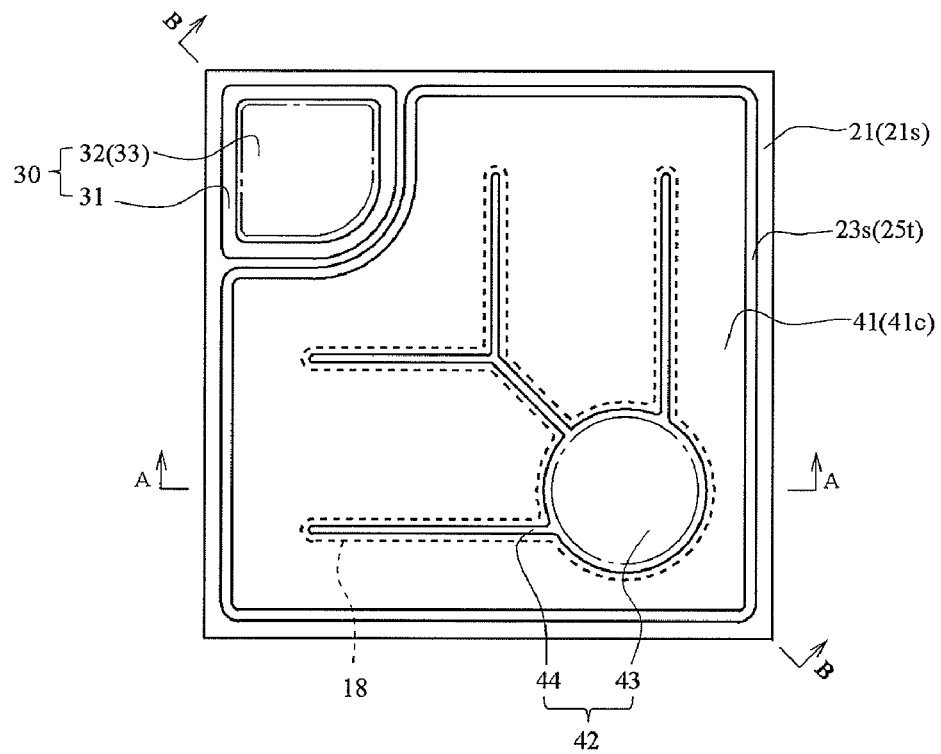
FIG. 1A is a schematic plan view of a light emitting element according to one embodiment of the present invention.

The preferred embodiments of the present invention will be described below with reference to the accompanying drawings. However, the light emitting elements and light emitting devices discussed below are merely given to embody the technological concept of the present invention, and the present invention is not limited thereto. Unless otherwise specified, the sizes, materials, shapes, relative layouts, and so forth of the constituent members are for illustrative examples, and do not intend to limit the invention therein. The sizes, positional relationships, and so forth of the members shown in the drawings may be exaggerated for clarity. In each constituting component of the present invention, multiple components may be constructed using the same member so that one member can serve as multiple components, or vice versa, a function of a member may be shared by multiple members.

First Embodiment

Referring to FIG. 1, a specific example of LED 100 according to a first embodiment and its structure will be described below. Here, in the present embodiment, FIG. 1A is a schematic planar view of LED 100 seen from the electrode arrangement face, and FIGS. 1B and 1C are schematic cross sectional views illustrating a part of a cross section along a line A-A and a line B-B of FIG. 1A respectively. FIG. 1D is a schematic cross sectional view illustrating a partially enlarged view of the circled portion in FIG. 1A. FIG. 1E is a schematic cross sectional view illustrating another structure different from the structure shown in FIG. 1D.

Figure 5A:
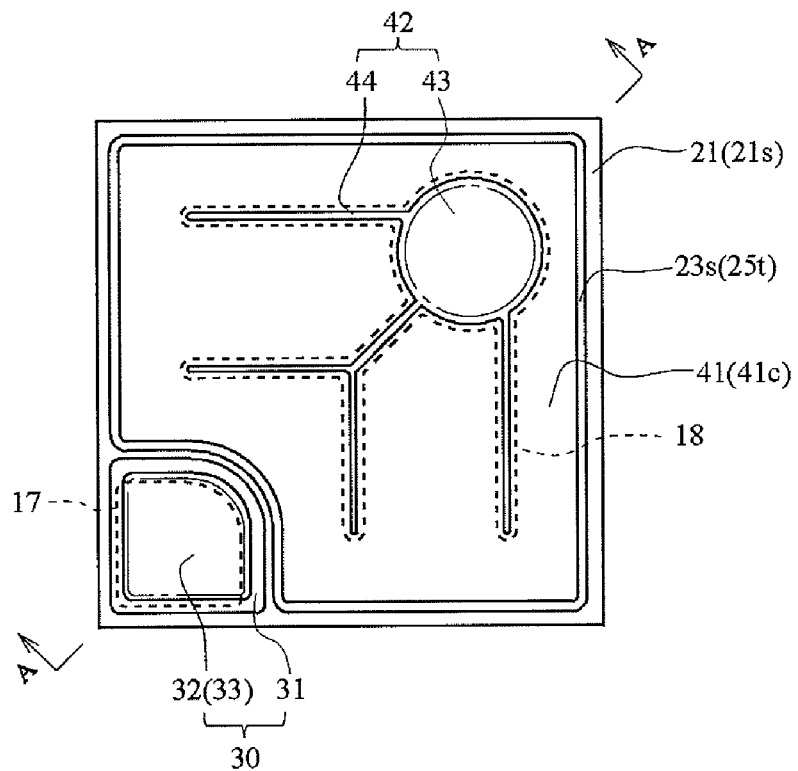
FIG. 5A is a schematic plan view of the light emitting element according to one embodiment of the present invention.
Figure 6A:
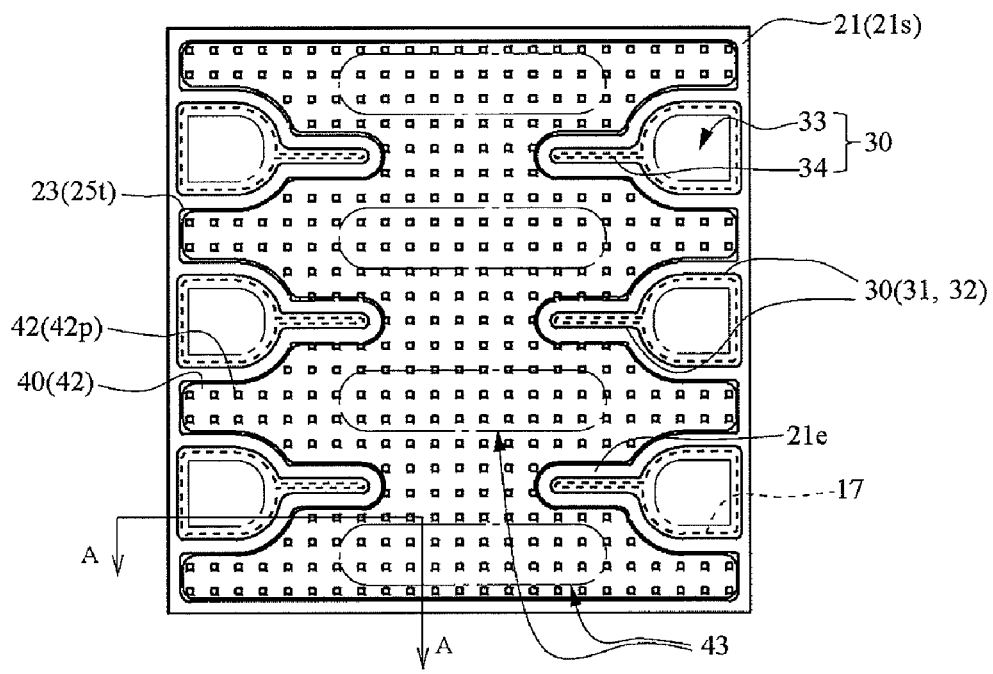
FIG. 6A is a schematic plan view of the light emitting element according to one embodiment of the present invention.

A structure of a light emitting element of FIG. 1 has a semiconductor structure 20 comprised of a layered structure obtained by laminating an n-type nitride semiconductor layer 21 as a first conductive type layer, an active layer 22 as a light emitting region, and a p-type nitride semiconductor layer 23 as a second conductive type layer on a substrate 10 via an underlying layer such as a buffer layer. Part of the n-type layer 21 is exposed to be provided with an n-electrode (first electrode) 30. A p-electrode (second electrode) 40 is provided on a p-type layer 23s as a surface 25t of a light emitting structure 25 provided with the first and second conductive type layers (and the active layer therebetween). In plan view (FIG. 1A), a protective film 51 is omitted, a protective film opening that acts as an external connecting part 33, 43 of each electrode is shown as a part surrounded by a chain dashed line of thin line, which is the same in each plan view of FIGS. 3, 4, 5A, 12, and 15. In FIG. 11A as well, the protective film is omitted, and the external connecting part and a second layer surface substantially coincide with the protective film opening and thus are omitted. In FIG. 6A, the protective film 51 is omitted, the first and second layer ends of each electrode substantially coincide and thus are shown with one line, a second light transmissive insulating film 18 has an opening and an projected part of the second layer that substantially matches thereto shown with a solid line, and the other regions omitted.

In the example of the element of FIG. 1, a first electrode 30 of substantially rectangular shape is arranged in an electrode forming region 21e. Therefore, first and second electrodes 30, 40 are respectively arranged on a light emitting structure portion 25 and the electrode forming region 21e of one part of an exposed part 21s exposed from the light emitting structure portion 25, where the second electrode 40 on a semiconductor structure 25t has a structure in which a first layer 41 of light transmissive conductive film and a second layer 42 connecting thereto are stacked by way of the light transmissive insulating film 18 at one part. The second layer of the electrode is formed by an electrode having a lower translucency than the first layer such as metal electrode having light shielding property, where since light absorption/loss occurs, at a boundary region of the light transmissive insulating film 18 and a second conductive type layer 23s (upper surface 25t of light emitting structure portion) of the semiconductor structure, specifically, at a boundary of with the insulating film 18 having a lower index of refraction than the semiconductor structure 20, the second conductive type layer 32, or the surface 23s region thereof, the light propagating through the semiconductor structure suppresses the light shield by the second layer forming region covering the relevant boundary, enables suitable light reflection by the reflection of the boundary between the insulating film in front thereof and the semiconductor thereby suppressing light loss, and is suitably taken out from an optical window of the side surface of the semiconductor structure 20, the upper surface 25t of the light emitting structure, the light transmissive substrate 10, and the like, in particular, from the covered region of the first layer 41. The first electrode 30 is arranged in the exposed part 21s of the semiconductor and connected to the semiconductor. As hereinafter described, the first electrode may have a structure including at least two layers of first and second layers 31, 32 as shown in FIG. 1B, similar to the second electrode, or may have a structure in which one part of at least the second layer is arranged by way of the light transmissive insulating film as shown in FIG. 2, in which cases, connection is made to the semiconductor layer with the first layer on the lower layer side.

In the example of FIG. 1, similar to the second electrode 30, the first electrode 30 has an electrode structure including at least a first layer 31 of transparent conductive film arranged on an electrode forming region 22e of the exposed part 21s serving as a non-light emitting portion and a second layer 32 arranged thereon, where a suitable electrode is obtained with a first layer having a wider cross sectional width and a larger area than the second layer. Furthermore, as shown in another example of FIG. 1C shown in FIG. 2, similar to the second electrode, the first electrode has a translucent insulating film 17 interposed between the second layer and the semiconductor layer, so that effects similar to the second electrode are obtained. The specific example related to FIG. 1 is configured with an ohmic electrode of the first layer of n-side electrode 30 and the p-side electrode 40, and a film in which ITO and Rh/Pt/Au are stacked in such order having the same structure as the external connecting electrode of the second layer.

Therefore, when arranging the first and second electrodes and the first and second layers thereof in substantially the same structure and in the same steps, that is, when the first layer and/or the second layer are formed at substantially the same film thickness, and have similar translucent insulating film, productivity is enhanced and thus is preferable.

The covered part of the second layer 42 that covers the upper surface of the translucent insulating film is not particularly limited, but as shown in FIG. 1, when arranging the external connecting part 43 thereon, the external connecting part is formed at a larger cross sectional width compared to other portions such as electrode elongated part 44 as shown in FIGS. 1, 3, 4, and 11, and requires a large area, whereby it is preferably to arrange at least the external connecting part on the covered part, and suitable light reflection is carried out at the external connecting part of wide width and large area. This is also preferably in that it excels in impact-withstanding property in time of external connection, and close adherence between the first layer of the lower layer and the translucent insulating film.

The present invention will be specifically described below, and specifically, a suitable light reflecting function to the inside of the semiconductor structure is provided and a window region for suitable light retrieval is formed at the first layer covered region serving as a current injecting and light emitting region that covers the first layer, in particular, the light emitting structure portion. On the other hand, the light loss of the second layer serving as a light shielding region is suppressed and a suitable light reflecting function to the inside of the semiconductor structure is provided at the translucent insulating film forming region or the second layer forming region, which is another region on the light emitting structure portion, specifically, the second layer covered region that serves as a current blocking region by way of the translucent insulating film.

Figure 1B:
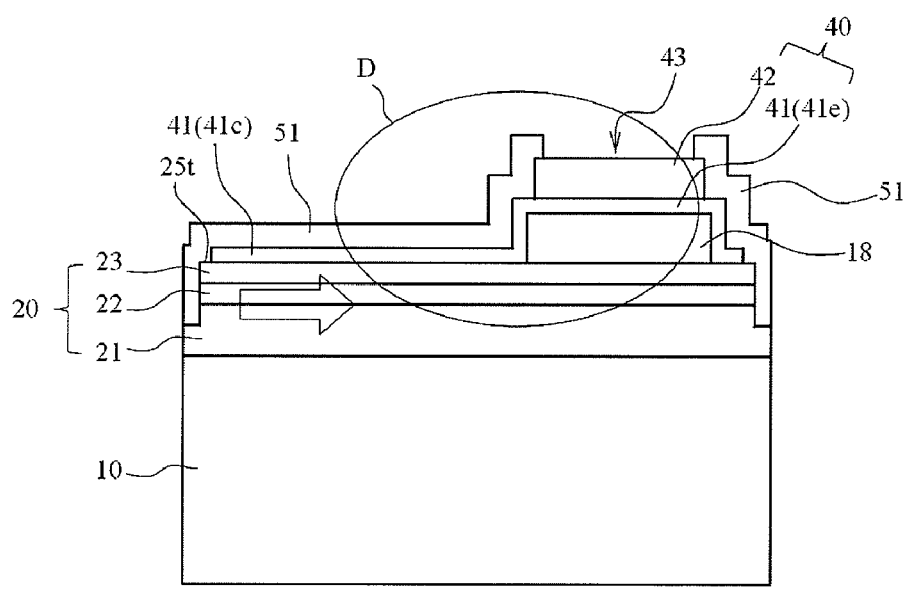
FIG. 1B is a schematic cross sectional view taken along line A-A of FIG. 1A.
Figure 1C:
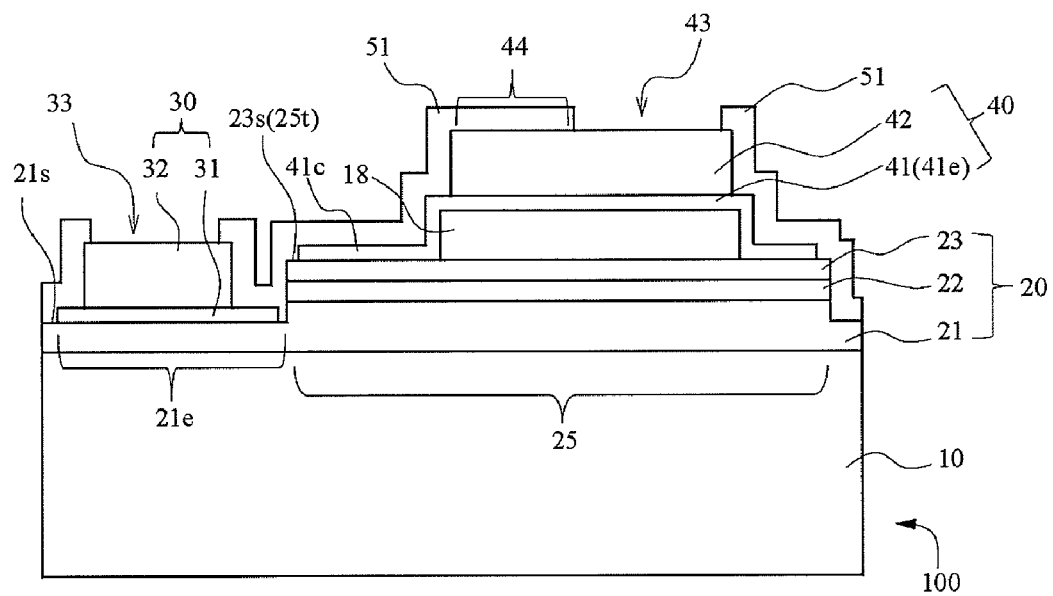
FIG. 1C is a schematic cross sectional view taken along line B-B of FIG. 1A.

In the semiconductor structure, the light inside is mainly divided into a light of transverse component and a light of longitudinal component as shown with an outline arrow of FIG. 1B, where the longitudinal component enters at a low angle with respect to the opposing main surface of the semiconductor structure, the surface on the first electrode forming surface side and the surface on the side facing thereto or the substrate 10 side of FIG. 1, and extracted immediately at the main surface it reaches. As shown with the arrow in the figure, the light of transverse component enters the main surface at high angle, where one part is extracted to the outside but most are reflected towards the inside and repeats such reflection to be propagated in the transverse direction. The semiconductor structure is a medium that is wide in the transverse direction as shown in the example (FIGS. 1, 3, 4, and 5) described below having a dimension: thickness of about 5 μm and width 320 μm (element outer shape: 320 μm×320 μm, exposed part, and electrode forming region width of 100 μm, and element outer edge of 20 μm). That is, the semiconductor structure is a medium in which the light path reaching to the surface of the semiconductor structure is an extremely long propagating distance in the transverse direction compared to the longitudinal direction. Furthermore, when evenly light emitting in all directions from the light emitting region, most of the light reaching the main surface of the light emitting structure is a light of transverse component due to the proportion occupying the solid angle of omnidirectional light emission. Therefore, most of the inside of the semiconductor structure is a light of transverse direction, and most of the light thereof is reflected to the inside, where the light emission element structure of the present invention is a structure for suitably controlling such transverse component.

Figure 1D:
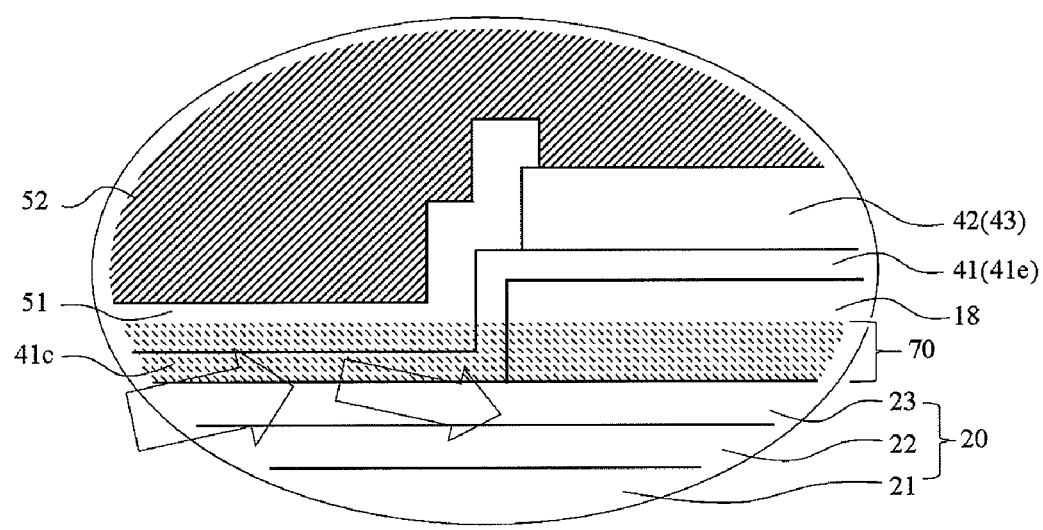
FIG. 1D is a schematic cross sectional view enlarging one part (circled portion) of FIG. 1B.
Figure 2:
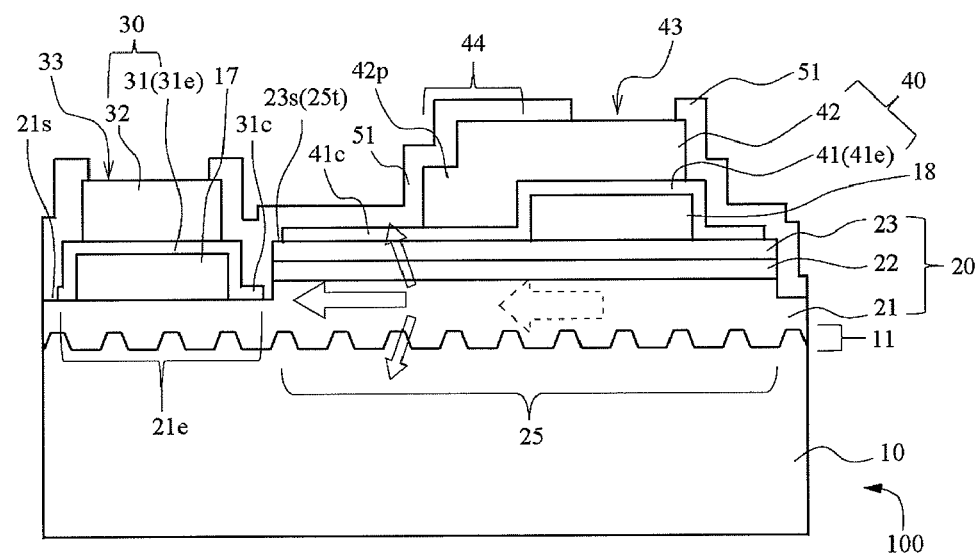
FIG. 2 is a schematic cross sectional view of the light emitting element according to one embodiment of the present invention.

Specifically, regarding the light of transverse component (outline arrow in the figure) shown in FIG. 1B, the light reflection of the transverse component is carried out at the main surface of the semiconductor structure, the light emitting structure portion occupying a large area thereof, and furthermore, the first layer covered region occupying a large area of the light emitting structure portion, as shown in FIG. 1D showing a portion surrounded with an ellipse in an enlarged manner. At the reflection of the transverse component, that is, the light component having a high incident angle at the first layer covered region, the light component is reflected at the boundary region of a material different from the material configuring the light reflecting part, and specifically, light reflection is carried out with the band region having a thickness of about the wavelength from the surface of the semiconductor structure as a light reflecting region (shaded part 70 in the figure), so that light runs out from the surface of the semiconductor structure into the boundary region and reflected.

The index of refraction of the optical medium at the thin film of about the wavelength is expressed with the equation of the complex index of refraction N of N=n−iκ, where n is the real number of the index of refraction, and iκ is the imaginary number. As hereinafter described, in the case of the dielectric film material suitably used for the light transmissive insulating film, the light transmissive member, and the insulative protective film, the extinction coefficient is κ=0, and the index of refraction N is the actual number n. When the extinction coefficient κ>0 as in ITO of the example to be hereinafter described, light absorption occurs in the boundary region and the light reflecting region (shaded part 70 in the figure) from the relational equation with the absorption coefficient α of α=4 πκ/λ.

Figure 1E:
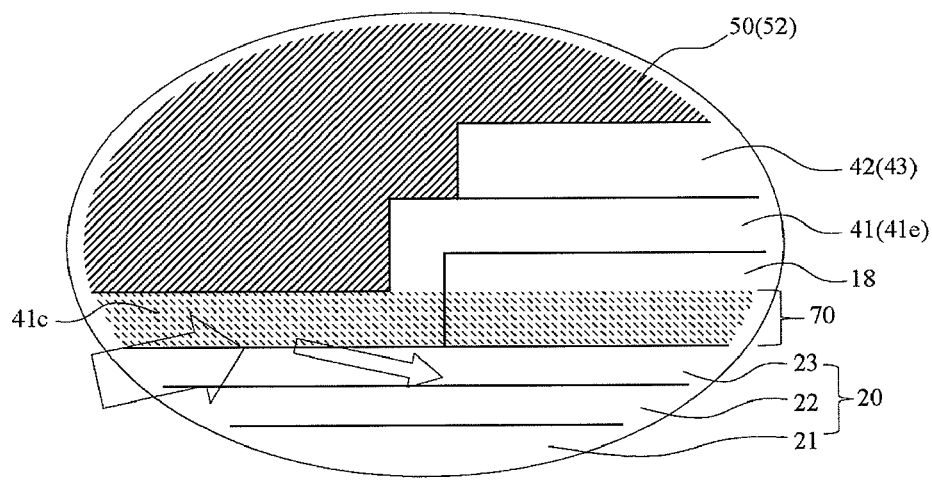
FIG. 1E is a schematic cross sectional view according to a variant of FIG. 1D.

In the structure shown in a comparative example to be hereafter described, the enlarged view (FIG. 1D near the first layer covered region and the second layer/light transmissive insulating film forming region shows a structure as shown in FIG. 1E, where the light of transverse component (outline arrow in the figure) enters at high angle and the light absorption occurs and the light attenuates at the reflected region of about the wavelength (λ/n$_1$, about 230 nm in the example) of the first layer. In the structure of the present invention shown in FIG. 1D, at the first layer covered region, the band shaped light reflecting region 70 is configured by a thin first layer, a light transmissive member covering the top thereof, and an insulating protective film, where suitable light reflection is realized by suppressing light absorption by the first layer and obtaining a high ratio for the incident light and the reflected light. In the second layer and/or light transmissive insulating film forming region, the light reflecting region is formed on the light transmissive insulating film of transparent material such as dielectric film (FIG. 1D), as described above, where suitable light reflection of the transverse component, and more suitably, total reflection by the light of greater than or equal to critical angle is realized.

In the forming region, as hereinafter after described as another function, as the current blocking region interposed with the insulating film, the light emitting structure portion under such region acts as a non-light emitting region, so that the light of longitudinal component due to light emission immediately below that easily reaches the insulating film, and furthermore, the second layer on the back side thereof is eliminated, and light emission under the first layer covered region at the vicinity thereof, in particular, the light of longitudinal component entering at low angle is reflected with the light reflection of high reflectance by the boundary region between the semiconductor structure and the translucent insulating film. Thus, it is preferably a current inhibiting and non-light emitting region.

The light reflecting mechanism of the transverse component as described above is obtained by the difference in substrate planarity in the examples hereinafter described, specifically, a flat substrate surface as shown in FIG. 1B, a substrate surface of concave-convex structure as shown in FIG. 2, and furthermore, comparison between the flat surface and the surface having a concave-convex structure at the main surface of the semiconductor structure facing the electrode forming surface such as comparison between examples 1A to 1C and 1a to 1c, and examples 2A to 2C and 2a to 2c. As shown in FIG. 2, such concave-convex structure 11 has a structure such that the light of transverse component (dotted arrow in the figure) is reached to the concave-convex surface, one part of such light is changed to longitudinal direction to have one part converted to a light of upward and downward component (solid line arrow in the figure), and one part of the transverse component converted to the light entering at low angle to the main surface in the short distance direction of the semiconductor structure is extracted to the outside thereby enhancing the light retrieving efficiency. Therefore, the light of transverse component in the semiconductor structure tends to decrease compared to the case with the flat surface as shown in FIG. 1B, and thus reflection is carried out by the light of transverse component decreased compared to the flat surface, whereby effects by the reflecting mechanism are lowered. This supports the reflecting region described above since the effect of the reflecting structure of the present invention tends to reduce at the concave-convex structure 11, as apparent from the comparison of example 1A to C and 1a to c, and 2A to C and 2a to c.

Each structure on the electrode forming surface side, in particular, at the light emitting structure portion having the light reflecting structure described above.

As shown in the specific example of FIG. 1, the light emitting structure is a light emitting structure in which the second electrode 40, in particular, the first layer covered region 31*c* arranged on 25*t* the light emitting structure portion 25 acts as the main light retrieving window region, specifically, the longitudinal component retrieving window region with one main surface side of the semiconductor structure 20 as the forming surface side of the first and second electrode 30, 40, and in which light is also extracted from other light shielding structure such as second electrode, exposed surface from the second layer of each electrode such as the exposed surface of the semiconductor structure, side surface, and another main surface (substrate side), and such light emitting structure is preferable in the present invention. As opposed to such example, the main surface side of the semiconductor structure facing the electrode forming side, in particular, the second electrode forming surface side may be the main light retrieving side and the electrode forming surface side may be the light reflecting side, in which case, the reflecting structure of reflecting the in the longitudinal direction at the first layer covered region and the translucent member such as the insulating protective film arranged thereon is realized by having the second layer as the reflecting electrode and arranging the dielectric multi-layer film and the metal reflecting film, to be hereinafter described, on the translucent member.

In the specific example of FIG. 1, a light reflecting region for reflecting the light while suppressing the loss of light of the transverse component low is formed at the first layer covered region and in addition, a complex material region of the translucent member covering the first layer, and in particular, the surface is arranged near the surface of the semiconductor structure by having the film thickness of the first layer small so that a suitable light reflecting part is formed at the surface, as described above. As shown in FIGS. 1B to 1D, the thin first layer is arranged in the light reflecting region, so that a great amount of reflection component by the light transmissive member preferably having an index of refraction lower than the semiconductor structure, and more preferably, having an extinction coefficient lower than the first layer exists on the surface, whereby a suitable light reflection is realized compared to when the index of refraction is high, so that a complex region of low absorption component is realized and a suitable reflecting structure obtained. As in examples 1, 2 hereinafter described, the first layer or the surface thereof is formed within a distance of $\lambda/2n_1$ from the surface of the semiconductor structure, and specifically, the film thickness of the first layer arranged on the surface of the second conductive type layer is made to less than or equal to $\lambda/2n_1$ as shown in the example, and more preferably, less than or equal to $\lambda/4n_1$ to sufficiently lower the light loss. The lower limit of the film thickness is not particularly limited, but as described in the specific example above, a structure sufficiently providing a function of spreading the current from the external connecting part of the second layer and furthermore, the elongated part elongating from the external connecting part as the base point to the first layer having a wider cross sectional width and a larger area at the first layer, in particular, the covered region thereof, and injecting current to the semiconductor structure, in particular, the light emitting structure portion is preferable. In this case, suitable current spreading and current injection, specifically, lower contact resistance of the lower sheet resistance of the first layer and the semiconductor structure is preferable, where as shown in the example to be hereinafter described, the structure of greater than or equal to 10 nm, or greater than or equal to 20 nm is preferable to suppress rise of Vf, which corresponds to around $\lambda/8n_1$, and is formed while ensuring an appropriate and suitable film thickness depending on the light emitting structure, the shape of the second layer, and in particular, the shape and the arrangement of the elongated part as shown in the following examples and embodiments.

Regarding the second layer region overlapping the translucent insulating film region, or at least one part of the translucent insulating film region, separately arranged from the first layer covered region on the semiconductor structure, in particular, the electrode forming surface side of the light emitting structure portion, the second layer is formed on the upper layer side as an electrode and electrically connected to the first layer of the lower layer side, specifically, it is formed with one part overlapping the first layer forming region. Preferably, as shown in the example of FIG. 1, a suitable reflecting mechanism is provided in the second layer and/or translucent insulating film forming region by connecting with the first layer extending part formed on the translucent insulating film, and more preferably, by including the second layer on the translucent insulating film, thereby increasing the effects.

In the reflecting mechanism in the forming region of the translucent insulating film, the reflecting region is formed at the boundary region of the semiconductor structure and the translucent insulating film, or preferably, the boundary region of the semiconductor structure and the translucent insulating film arranged on the surface thereof. As shown in FIGS. 1D and 1E, the translucent insulating film surface is preferably arranged on the outer side than the band shaped reflecting region 70 of about one wavelength, specifically, preferably arranged on the surface of the semiconductor structure at a thicker thickness. Since the film thickness of the surface of the translucent insulating film is sufficient, the light of transverse component is suitably reflected, and the light reaching the second layer for light absorption such as upward light in the direction of the arrow as shown in FIG. 2 is suitably reflected, and preferably, totally reflected by light shielding property.

The distance from the surface of the semiconductor structure to the surface of the translucent insulating film, specifically, the film thickness of the insulating film arranged on the surface of the semiconductor structure is larger than the distance or the film thickness to the surface of the first layer, as described above and will be described in the following examples, or is greater than or equal to $\lambda/4n_2$ ($\lambda$ is the light emitting wavelength of the light emitting element, and $n_2$ is the index of refraction of the translucent insulating film) and preferably greater than or equal to $\lambda/2n_2$ to obtain a suitable reflecting structure, where the upper limit of the film thickness is not particularly limited, but at the first layer covered region, the surface of the insulating film of longer distance than the surface or the surface of the insulating film of larger film thickness is obtained, and the film thickness is larger than the sum of the distance of the surface of the protective film and the surface of the semiconductor structure or the film thickness of the first layer and the protective film, as shown in FIGS. 1B and 1C, whereby a suitable light reflecting region is formed at the insulating film forming region. In this case, the specific distance or the film thickness merely needs to be greater than or equal to about one wavelength ($\lambda/n_2$).

As apparent from the examples to be hereinafter described, a structure of suitable light output and element characteristics is obtained by having the thickness of preferably around $\lambda/2n_2$, more specifically, $\lambda/2n_2 \pm \lambda/4n_2$ (greater than or equal to $\lambda/4n_2$ and less than or equal to $3\lambda/4n_2$). In the region of less than or equal to $\lambda/2n_2$, the reflectance, in particular the incident angle becomes higher angle from the critical angle, according to the thickness of the medium, and the reflectance at the region near the critical angle especially rises, but such rise in reflectance has slow percentage or rise at the region of greater than or equal to $\lambda/2n_2$ (e.g., up to $\lambda/n_2$ or over $\lambda/n_2$), and specifically, satisfactorily matches with the tendency to transition to slow percentage of rise seen at the range of $\lambda/2n_2 \pm \lambda/4n_2$. Therefore, suitable reflection is carried out in the range of $\lambda/2n_2 \pm \lambda/4n_2$ with respect to the light emission of the region spaced apart from the light transmissive insulating film forming region in which the incident angle is a high angle, in particular, the light emission near the insulating film forming region in which the incident angle is near the critical angle where the light quantity is large, and can be suitably applied to the current inhibiting region structure by the insulating film. The light emitting element structure having a suitable light property similar to within the above range is obtained even if the range (upper limit $3\lambda/4n_2$) is exceeded, for example, one wavelength or greater than one wavelength.

Figure 7:
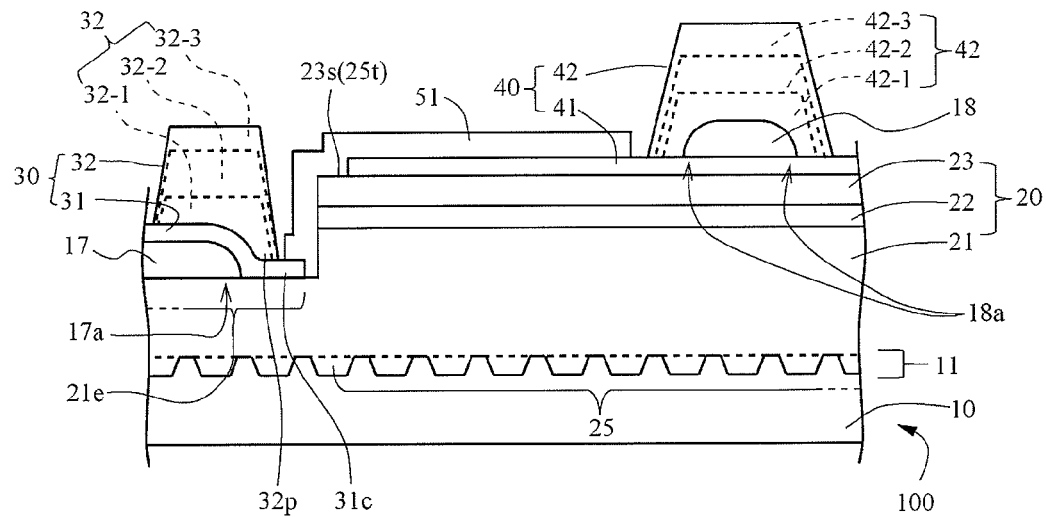
FIG. 7 is a schematic cross sectional view of one part of the light emitting element according to one embodiment of the present invention.
Figure 8:
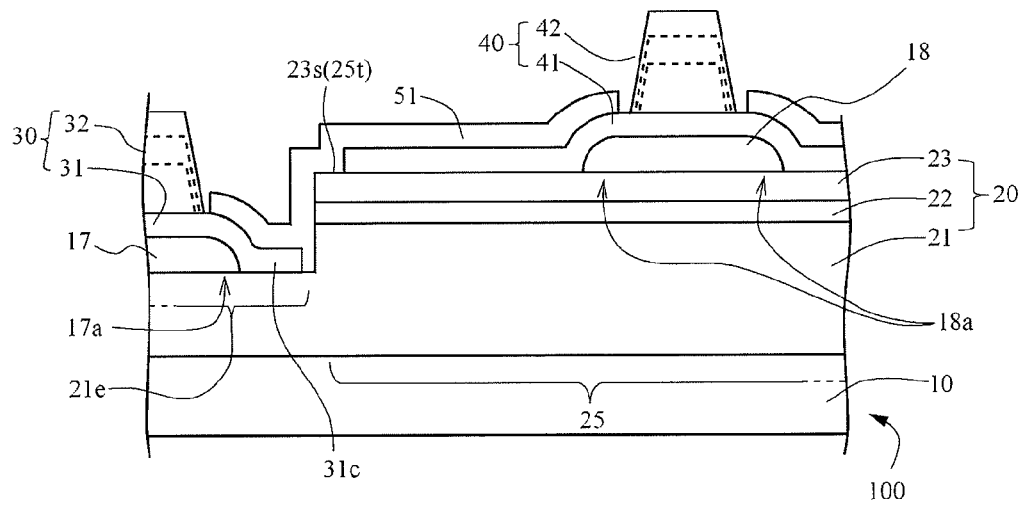
FIG. 8 is a schematic cross sectional view of one part of the light emitting element according to one embodiment of the present invention.

As shown in FIGS. 1B to 1D, when the translucent insulating film becomes thicker, a large step difference is created between the surface 25t of the light emitting structure portion and the first layer covered region 41c, and thus problems such as partial disconnection and stripping arise at the electrode formed across the step difference, the first layer and the protective film 51 in the example of FIG. 1, and the first and second layers and the protective films 17, 18 of the first and second electrodes 30 40 in the example of FIGS. 7 and 8, which become the causes of variation in the manufacturing yield and the characteristics of the element. As described above, such problems become significant when thinning the thickness of the first layer, and furthermore, when spacing the protective film away from the insulating film, and when extending the first layer up to the insulating film and spacing the second layer away from the first layer covered region.

Figure 9:
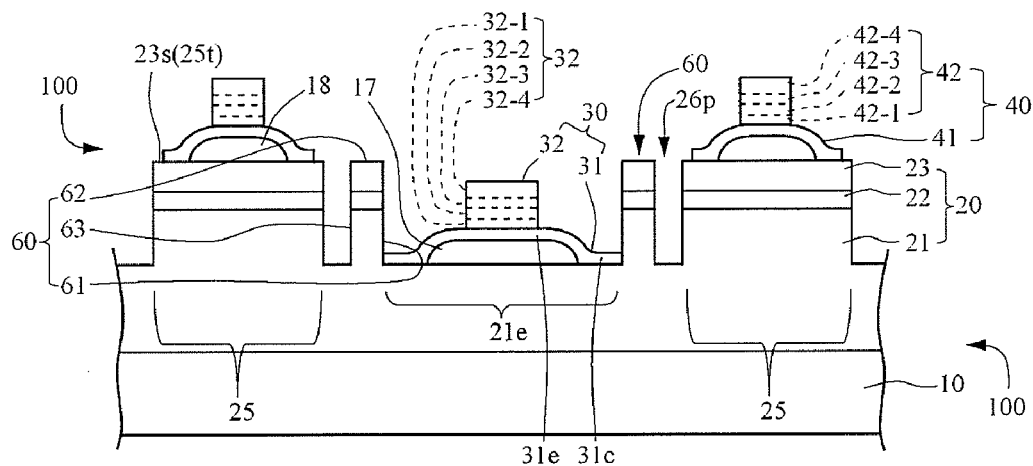
FIG. 9 is a schematic cross sectional view of one part of the light emitting element according to one embodiment of the present invention.

The step difference has a structure in which the first covered region 41c (31c) and the forming region of the insulating film 18 (17) and furthermore, the second layer forming region are arranged in the electrode forming surface of the semiconductor structure, in particular, in the surface 25t of the light emitting structure portion 25, and is the boundary region between such regions. At the boundary region, the change in optical distribution becomes large at the reflecting region when the step difference becomes large and exceeds one wavelength ($\lambda/n_2$), which might adversely affect the optical characteristics such as directivity. The change at the boundary region can be made small by arranging the thin film part 61, 62 at the end side, as shown in FIGS. 8, 9, and 11. The reflecting region is made to a similar complex member other than that the arrangement of the member is inverted at the covered region and the insulating film forming region, and the difference between the regions can be made small when the translucent insulating film is in the above range ($\lambda/2n_2 \pm \lambda/4n_2$) and the first layer extending part is arranged on the insulating film.

[Specific Example/Manufacturing Example of Light Emitting Element]

EXAMPLE 1

The details and the manufacturing method of the present embodiment will now be described using example 1.

A semiconductor element, specifically a layered structure (emission wavelength of 460 nm, blue LED), for example as shown in FIG. 1 according to the present embodiment, may be used, which is formed by stacking, on the substrate, an underlayer including GaN buffer layer of 20 nm thickness and undoped GaN layer of 1 μm thickness, a first conductive type layer 22 (n-type layer) including an n-side contact layer of GaN doped with Si of $4.5 \times 10^{18}/cm^3$ of 5 μm thickness, a multilayer between the contact layer and an active layer including an undoped GaN layer of 0.3 μm thickness, a GaN layer doped with Si of $4.5 \times 10^{18}/cm^3$ of 0.03 μm thickness, an undoped GaN layer of 5 nm thickness, and ten layers of alternately stacked undoped GaN layer of 4 nm and undoped $In_{0.1}Ga_{0.9}N$ layer of 2 nm, an active layer 22 having a multiple quantum well structure including six layers of alternately stacked a barrier layer of undoped GaN of 25 nm thickness and a well layer of $In_{0.3}Ga_{0.7}N$ of 3 nm thickness, a second conductive type layer (p-type layer) 23 including a p-side multi layer having five layers of alternately stacked $Al_{0.15}Ga_{0.85}N$ layer doped with Mg of $5 \times 10^{19}/cm^3$ of 4 nm thickness and $In_{0.03}Ga_{0.97}N$ layer doped with Mg of $5 \times 10^{19}/cm^3$ of 2.5 nm thickness, and an $Al_{0.15}Ga_{0.85}N$ layer doped with Mg of $5 \times 10^{19}/cm^3$ of 4 nm thickness thereon, and a p-side contact layer of GaN doped with Mg of $1 \times 10^{20})/cm^3$ of 0.12 μm thickness. Further, thermal treatment (700° C.) is carried out in a reactor vessel to lower the resistance of the p-type layer.

(Manufacturing a Non-emitting Part and Light Emitting Structure Region)

The first conductive type layer exposed region 21s and the light emitting structure region 25 are defined by processing/removing part of the layered structure 20 by etching into a desired shape by etching or the like. A specific example is that, in the above structural example, a mask of $SiO_2$ or the like in a desired shape is provided by photolithography from the p-type layer side, and part of the n-type contact layer in its depth direction is removed by etching such as RIE (reactive ion etching), to form the exposed region 21s and the first electrode formation region 21e (the recessed notched section 22a in the example of FIG. 1) in a part thereof.

(Light Transmissive Insulating Film 18)

The light transmissive insulating film of $SiO_2$ is arranged on the exposed electrode forming surface side of the semiconductor structure. Specifically, a mask of a resist is formed through photolithography, and a translucent insulating film 18 of a desired shape is arranged on a second conductive type layer (p-side contact layer in the p-type layer) that acts as an upper surface 25t of the light emitting structure portion.

(Electrodes 30, 40)

After forming an ITO (about 20 nm) on the electrode forming surface side of the semiconductor structure as translucent ohmic electrodes (first layer) 31, 41 of the first electrode 30 (n-type electrode) and the second electrode 40 (p-type layer side) on the first and second conductive type layers, a mask of a resist is formed through photolithography, one part of the ITO is removed by etching, and a first layer of a desired shape covering the translucent insulating film 18 on each conductive type layer and the second conductive type layer is formed. After forming the mask through photolithography as a second layer 32, 42 including each pad electrode (external connecting part 33, 43) and an electrode elongated part 34, 44 extending therefrom so as to overlap one part of the first layer 31, 41 and the translucent insulating film 18, the films of a structure in which Ti (about 2 nm)/Rh (about 200 nm)/Au (about 600 nm) are stacked in order are formed, and lift off is carried out to form to a desired shape. Therefore, preferably, the first and second electrodes 30, 40 are simultaneously formed, specifically, each layer of each electrode is formed in the same step to reduce the manufacturing steps, but may be formed with different steps, different materials, and stacked structure. Subsequently, the electrode is annealing processed in the thermal treatment of greater than or equal to 300° C. to reduce the contact resistance of each electrode and each conductive type semiconductor layer.

In the third embodiment and FIG. 5, lower resistance is achieved than the first layer covered part 41c exposed from the projected part 32p at the first electrode 30 and the projected part 32p of the second layer projecting over the first layer covered part 31c. Lower resistance is obtained in the first layer at the second electrode 40 compared to the region exposed from the second layer and the insulating film, the region in which the region on the outer side is covered, or the region on the inner side, and thus the second layer is preferably spaced part from the first layer, in particular, the covered part 31c thereof, and the second layer is preferably included at the surface of the insulating film. When arranging the first layer interposed part between the insulating film and the semiconductor structure, the interposed part is controllable as a current injecting part or a current inhibiting part using such nature. In this case, the contact resistance is reduced in the first layer of the first electrode in thermal treatment in the exposed state after forming the first layer, and in the first layer of the second electrode in thermal treatment in the covered state of the projected part of the second layer after forming the first layer. Thus, in the example of the structure including the interposed part of FIG. 6, the first layer is formed as each electrode, the first layer of the first electrode is exposed and subjected to thermal treatment to form the current injecting part of the interposed part of the second electrode, and the second electrode is arranged with the projected part of the second layer and subjected to thermal treatment. Thus, when the first and second electrodes have the same steps and structures, two thermal treatments, first for lowering the resistance of the interposed part of the second electrode and the second for lowering the resistance of the first layer under the projected part in the first electrode, are performed.

(Protective Film 50)

In this example, as shown with a thin chain dashed line of FIG. 1A, SiO$_2$ of 200 nm is formed over the entire surface as the protective film 50 for exposing the external connecting parts 33, 43 of each electrode (second layer) through etching etc., and covering the other regions, and thereafter, a resist mask is formed through photolithography, and dry etching is performed with RIE to form an opening.

Lastly, the substrate 10 is divided to a square of 320 μm×320 μm, to form an LED chip having a light emitting wavelength of about 460 nm. In this example, substantially the center part having twice the width in the wafer before division is set as the dividing position at the n-type layer exposed width of about 20 μm of the element peripheral edge part. The index of refraction of each light transmissive material has a relationship of $n_s > n_1 > n_{2,3}$, where the index of refraction $n_1$ of the translucent conductive film is about 2.00 (ITO), the index of refraction $n_2$, $n_3$ of the translucent insulating film and the protective film is about 1.46 (SiO$_2$), the index of refraction of $n_s$ of the semiconductor structure is about 2.46 (GaN).

The size of each structure shown in the above examples is as follows. The thickness of the substrate 10 is about 50 to 200 μm (about 90 μm in the above example). In the layered structure 20, the thickness of the underlayer is about 1 to 3 μm, the thickness of the n-type semiconductor layer 21 is about 2 to 5 μm, the thickness of the active layer or light emitting layer 22 is 10 to 150 nm, the thickness of the p-type semiconductor layer 23 is about 100 to 300 nm. The height from the exposed surface 21s of the n-type layer to the light emitting structure is about 0.5 to 3 μm (about 1.5 μm in the above example). The thickness of each of the first layer (ohmic electrode) is about 10 to 500 nm. The thickness of the second layer (pad electrode and elongated portion) is about 0.3 to 1.5 μm. The width or diameter of the external connection portion and the pad electrode is about 50 to 150 μm. the width of the electrically conductive part (second layer) of when the electrode forming surface side is the light retrieving side is 3 to 20 μm. The distance between the ends (cross sectional width of the projecting part of the insulating layer) of the electrically conductive part and the insulating part of when the second layer (pad electrode, extending electrically conductive part) is arranged spaced apart from the covered region in the insulating layer 18 is about 3 to 10 μm. As shown in FIG. 2, similar to the first electrode and the second electrode, the cross sectional width of the covered region 31c extended from the insulating film of the first layer of the first electrode is about 3 to 20 μm when the translucent insulating film 17 is arranged, and the cross sectional width of the projected parts 32p and 42p is about 0 to 30 μm in the second electrode and 3 to 20 μm in the first electrode when the second layer is arranged extending from the insulating film to the covered region.

The film thickness of the ITO of the first layer and the translucent insulating film is changed in the light emitting element obtained as above to review the dependency thereof. As shown in FIG. 2, in the reviewed example, the first electrode has the light transmissive insulating film 17 arranged substantially in the same region as the second layer in the same step, and arranged on both sides of the translucent insulating film with the width of the second layer of the second electrode elongated part of about 3 μm, and the cross sectional width of the covered region (extending part exposed from the second layer) of the first layer of the first electrode of about 10 μm, similar to the second electrode.

The reviewed example is similar to the examples 1A to 1C other than that the film thickness of the translucent insulating film (SiO$_2$) is 20 nm (example 1A) and 200 nm (example 1B) and 400 nm (example 1C) of substantially the same film thickness as the protective film, and the translucent insulating film is removed as a comparative example 1. In each example 1A to 1C and the comparative example 1, the examples 1a to 1c, and the comparative example 1' are formed with the concave-convex structure arranged on the surface of the substrate, as shown in FIG. 2. Evaluating such examples with the light emitting device 200 of shell lamp having a diameter of 5 mm sealed and molded by epoxy resin as shown in FIG. 13B, the element having the characteristics of table 1 is obtained. Each characteristic evaluation item in the table includes forward voltage Vf at If=20 mA, main wavelength $\lambda_d$, and integrating sphere $\phi_e$ as a light flux.

Compared to comparative example 1 (1'), the area of the contacting part of the first layer and each conductive type layer, that is the proportion of the covered region of the first layer reduces, and thus Vf of examples 1A to 1C, 1a, and 1b tends to increase by about 0.2 to 0.3V, excluding example 1b. The light flux enhances by 6%, 16%, and 16% in examples 1A to 1C compared to comparative example 1, and enhances by 6%, 10%, and 10% in examples 1a to 1c compared to comparative example 1'. The power efficiency of Wall-Plug Efficiency (W.P.E) increases by about 3% (examples 1B, 1C) from that of the same extent (example 1A) compared to comparative example 1, but tends to lower compared to comparative example 1' in examples 1a to 1c.

TABLE 1

|  | Vf[V] | $\phi_e$[mW] | W.P.E[%] | $\lambda_d$[nm] |
|---|---|---|---|---|
| Example 1A | 3.34 | 28.7 | 42.9 | 459.1 |
| Example 1B | 3.38 | 31.2 | 46.2 | 460.8 |
| Example 1C | 3.42 | 31.3 | 45.8 | 460.5 |
| Comparative example 1 | 3.13 | 27.0 | 43.0 | 459.5 |
| Example 1a | 3.26 | 33.3 | 52.2 | 449.9 |
| Example 1b | 4.11 | 34.5 | 50.9 | 449.9 |
| Example 1c | 3.26 | 34.5 | 41.9 | 449.7 |
| Comparative example 1' | 3.01 | 31.4 | 51.8 | 450.4 |

Therefore, comparing examples 1a, 1b and 1c, and 1A and 1B to 1C in which the thickness of the translucent insulating film differs, light output enhances by about 4 to 9%. The ½ wavelength of the translucent insulating film $\lambda/2n_2$ is about 154 nm (when $\lambda$=450 nm), and about 157 nm (when $\lambda$=460 nm), where the relationship with the film thickness of the insulating film is [Example 1A (1a)]<$\lambda/2n_2$<[Example 1B (1b)]<[Example 1C (1c)]; the relationship with ¼ wavelength before and after ½ wavelength and one wavelength is [Example 1A (1a)]<$\lambda/4n_2$<$\lambda/2n_2$<[Example 1B (1b)]<$3\lambda/4n_2$<$\lambda/2n_2$<[Example 1C (1c)]; and suitable light output is obtained near $\lambda/2n_2$ of example 1B (1b), specifically, $\lambda/2n\pm\lambda/4n_2$ (greater than or equal to $\lambda/4n_2$ and lower than or equal to $3\lambda/4/n_2$). The Vf tends to increase the thicker the film thickness of the insulating film from the comparison of example 1A (1a) and example 1C (1c), where Vf is assumed to increase from the relationship of the film thickness step difference of the insulating film and the first layer covering the same.

Figure 14:
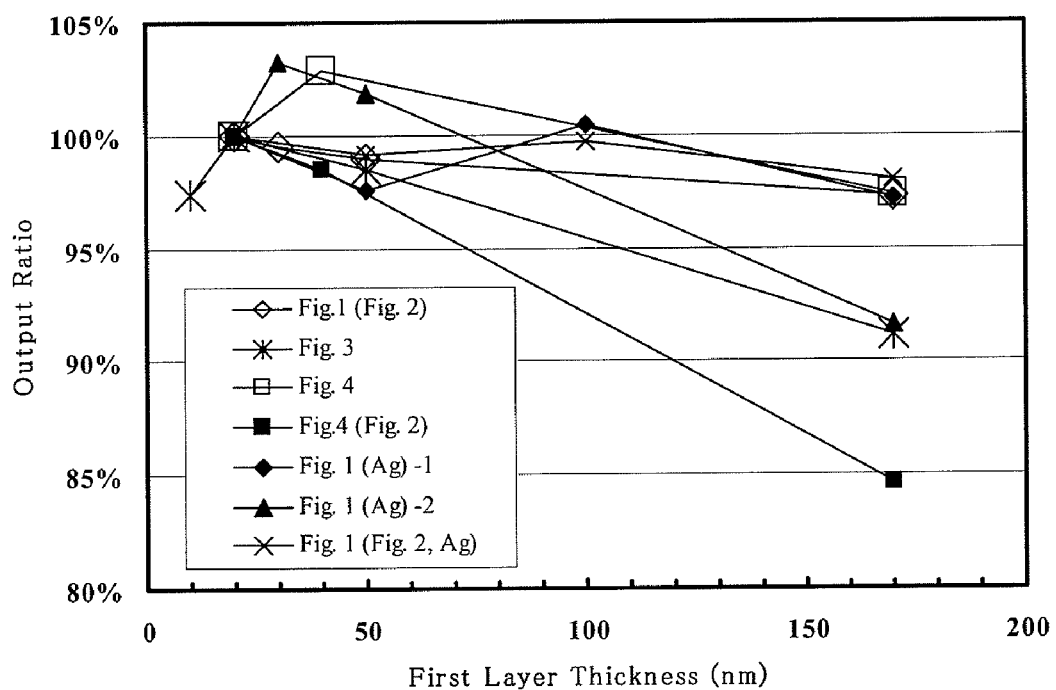
FIG. 14 is a view explaining a relationship between first layer and output characteristics of the light emitting element according to one embodiment of the present invention.

In the structure shown in example 1 (reviewed example, structure of FIG. 1), and in addition, the following reviewed example, second embodiment/example 2 (structure of FIG. 4), seventh embodiment/example 6 (structure of FIG. 3), and comparative examples thereof, the light emitting element is manufactured while changing the film thickness of the ITO of the first layer between 20 nm and 170 nm, whereby the output characteristics as shown in FIG. 14 are obtained. In order to cancel out the output difference caused by structural difference, each structure is standardized with the film thickness of the first layer as 20 nm with respect to the light emitting output (mW) of If=20 mA, where the figure number in the legend corresponds to the structure of each figure, and the parentheses indicates FIG. 2 having the concave-convex structure shown in FIG. 2, Ag including the Ag reflecting layer as hereinafter described at the lower layer of the second layer, where "−1, −2" at the end indicates being related to the example of another series.

Apparently, in the region over 50 nm, the output tends to decrease with increase in film thickness, and in the region of greater than or equal to 20 nm and lower than or equal to 50 nm, the region of high output is obtained, in particular, the output tends to increase with decrease in film thickness.

Second Embodiment

Figure 4:
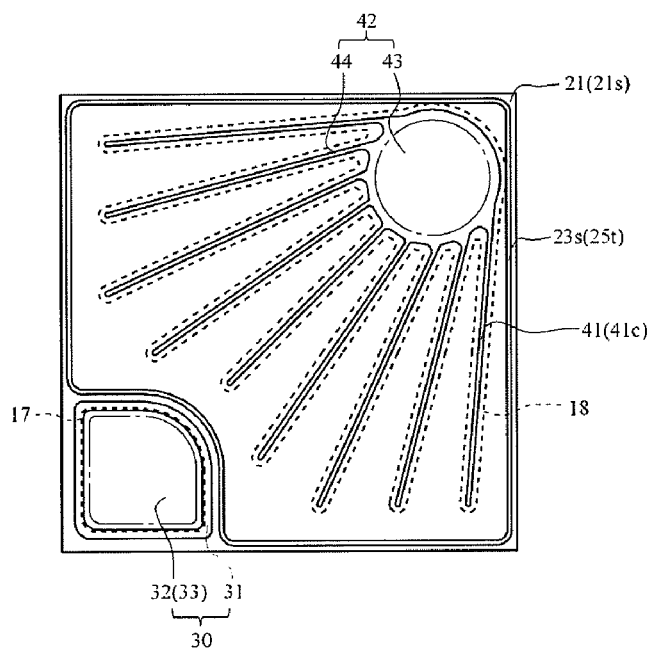
FIG. 4 is a schematic plan view of the light emitting element according to one embodiment of the present invention.

In the first embodiment and example 1, the second embodiment forms a light emitting element having a similar structure as example 1 and having a dimension of substantially a square of 320 μm other than that the number of elongated parts is four (example 1) to nine, and the light transmissive insulating film corresponding to the elongated part (second layer) and the electrode shape is arranged, with the shape of the elongated part 44 of the second electrode (p electrode) as shown in FIG. 4.

In this light emitting element, the number and the area of the electrode elongated part is greater than in example 2, and thus current spreading etc. enhances, but light emitting area lowers due to increase in the area of the translucent insulating film, whereby the output of the element tends to slightly lower than in example 2.

Figure 3:
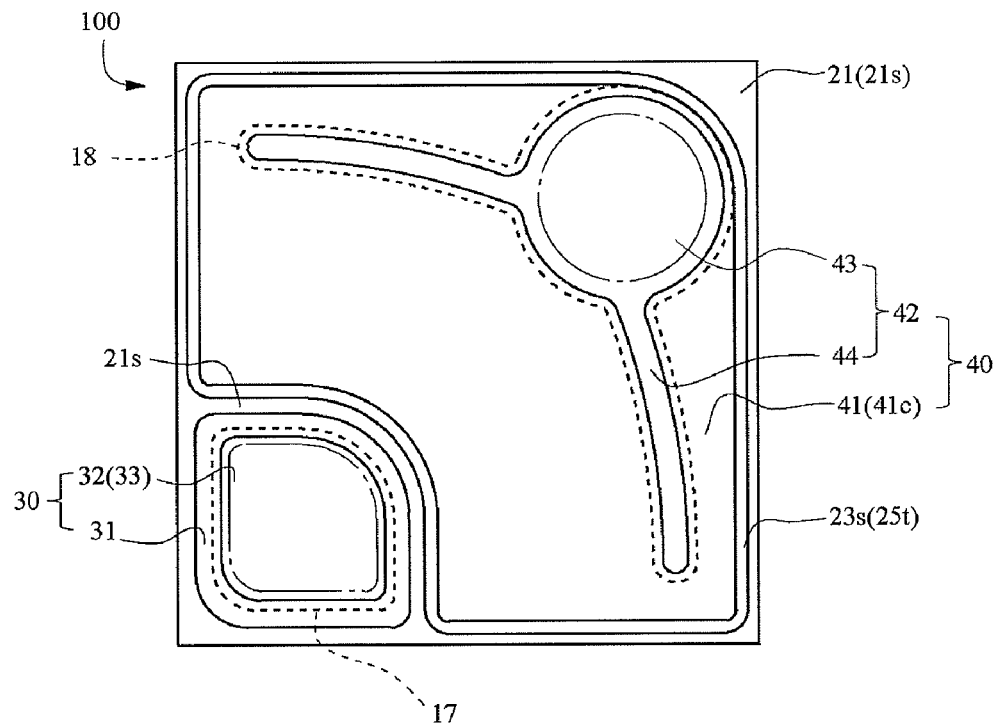
FIG. 3 is a schematic plan view of the light emitting element according to one embodiment of the present invention.

Specifically comparing, the second layer of the second electrode and the translucent insulating film are formed with the condition of substantially the same region similar to reviewed example (examples 1A to 1C, 1a to 1c) of example 1, and the first electrode has the translucent insulating film and the first layer omitted as shown in FIG. 1 different from the reviewed example of example 1, the light emitting element having a structure of example 1, example 2, and example 3 shown in FIGS. 1A, 3, and 4 are respectively formed. Similar to example 1B, the film thickness of the translucent insulating film and the first layer are 200 nm and 20 nm, and the substrate is also a substrate having a flat surface similar to example 1B. The light emitting element formed in this manner is evaluated with the light emitting device 200 of shell type of FIG. 13B, similar to the review of example 1 to obtain an element having the characteristics shown in table 2.

TABLE 2

|  | Vf[V] | $\phi_e$[mW] | W.P.E[%] | $\lambda_d$[nm] |
|---|---|---|---|---|
| Example of FIG. 4 | 3.33 | 29.7 | 44.7 | 458.5 |
| Example of FIG. 3 | 3.16 | 28.5 | 45.1 | 459.2 |
| Example of FIG. 1A | 3.20 | 30.6 | 47.9 | 457.4 |

From this evaluation, a tendency that Vf increases when the number of electrode elongated part 44 is two as in the example of FIG. 4, compared to when the number of electrode elongated part is nine or four in FIGS. 3 and 1A, is seen by having the translucent insulating film as the current inhibiting part, which is assumed as the effect of increase in sheet resistance caused by thinning of the translucent conductive film. Increase in the number and the area of the extending part increase the area of the translucent insulating film and lowers the light emitting area, and thus light output and power efficiency of the same extent are obtained in the example of FIGS. 4 and 3, and high light output and power efficiency compared thereto are obtained in the example of FIG. 1A which corresponds to the intermediate case of FIGS. 4 and 3. Therefore, the element structure is formed taking into consideration the electrode shape, in particular, the shape of the second layer and the elongated, as well as the shape and the area of the translucent insulating film accompanied therewith thinning of the translucent conductive film.

EXAMPLE 2

In example 1, as shown in FIG. 4, the light emitting element having a structure in which the elongated part 44 having a width of about 3 μm includes nine second layers 42, and other structures have similar structure and dimension.

The light emitting element is manufactured similar to the example of FIG. 4 of table 2 other than that the film thickness of the first layer is 20 nm (example 2A), 40 nm (example 2B), and 170 nm (example 2C), and that the flat substrate of each example 2A to 2C is a substrate having a concave-convex structure as shown in FIG. 2 (examples 2a to 2c), and evaluated with the light emitting device to obtain an element having the characteristics of table 3. For comparison, each characteristic of comparative examples 3 and 3' (structure in which translucent insulating film is omitted in the example of FIG. 3) is also shown. Furthermore, as another reviewed example, an element having a structure in which the translucent insulating film of example 2A' is omitted is manufactured as an example 2A' similar to example 2A and comparative example 2A, and such element chip is evaluated obtain an element having the characteristics of table 3. In table 4, $\lambda_p$ is the peak wavelength, and others are the same as tables 1 to 3.

TABLE 3

|  | Vf[V] | $\phi_e$[mW] | W.P.E[%] | $\lambda_d$[nm] |
| --- | --- | --- | --- | --- |
| Example 2A | 3.11 | 28.7 | 46.1 | 455.2 |
| Example 2B | 3.11 | 29.5 | 47.5 | 453.5 |
| Example 2C | 3.10 | 28.0 | 45.2 | 452.7 |
| Comparative example 3 | 3.04 | 26.3 | 43.2 | 455.8 |
| Example 2a | 3.07 | 32.6 | 53.1 | 451.1 |
| Example 2b | 3.07 | 32.1 | 52.2 | 451.3 |
| Example 2c | 3.06 | 27.6 | 45.0 | 451.9 |
| Comparative example 3' | 2.99 | 30.8 | 51.5 | 451.0 |

As described above, compared to comparative examples 3 (3'), high output and high power efficiency are obtained in examples 2A (2a), 2B (2b), and 2C, and low output and low power efficiency are obtained in example 2c. Comparing the film thickness of each conductive film at the wavelength of the light transmissive conductive film (index of refraction of $n_2$=2.00), the ½ wavelength and the ¼ wavelength, and the sum of the film thickness of the protective film (200 nm) therewith, [Example 2A (2a)]<[Example 2B (2b)]<[$\lambda/2n_2$]< [Example 2C (2c)]<[$\lambda/n_2$], and furthermore, [Example 2A]< [Example 2B]<[$\lambda/4n_2$], [$3\lambda/4n_2$]<[Example 2C], and [Sum of example 2A]<$\lambda/n_2$<[Sum of example 2B]<$3\lambda/2n_2$<[Sum of example 2C]<[$7\lambda/4n_2$] are obtained.

TABLE 4

|  | Vf[V] | $\phi_e$[mW] | W.P.E[%] | $\lambda_d$[nm] | $\lambda_p$[nm] |
| --- | --- | --- | --- | --- | --- |
| Example 2A' | 3.09 | 31.0 | 50.2 | 454.4 | 448.8 |
| Comparative example 2A | 3.10 | 30.2 | 48.7 | 453.4 | 447.9 |

As described above, compared to comparative example 2A, the example 2A' enhances the output by about 3%, and also enhances the power efficiency at the same extent of Vf.

Third Embodiment

A specific example of the LED 100 according to the third embodiment, that is, the element structure including at least a first electrode and a first light transmissive insulating film, and the configuration thereof will be described using FIG. 5. The structure including the second light transmissive insulating film 18, that is, the embodiment of the preferred light emitting element will be described for the second electrode, but is not limited thereto, and the second electrode may have a structure in which an insulating film is not arranged in the present embodiment, which is the same for the fourth, the fifth, and the sixth embodiments. FIG. 5A is a plan view of the LED according to the first embodiment seen from the electrode forming surface side, and FIG. 5B is a schematic view describing the cross section taken along line A-A of FIG. 5A.

Similar to the first and the second embodiments, the structure of the light emitting element of FIG. 5 has an element structure in which a semiconductor structure 20 is arranged on a substrate 10, an n electrode (first electrode) 30 is arranged on an n-type layer 21, and a p electrode (second electrode) 40 is arranged on a p-type layer 23s.

The specific example of FIG. 5 is substantially the same as the example of FIG. 1 of the first embodiment other than in the element structure and the electrode structure regarding the following points. The first electrode 30 of the exposed part 21s has a structure including at least two layers of first and second layers 31, 32, where one part of at least the second layer is arranged by way of the translucent insulating film, and the first layer is connected to a semiconductor. The material of the first and second layers 31, 32 of the first electrode 30 is the same as the second electrode, and the structure thereof is also the same. Specifically, when the light propagating through the semiconductor structure is extracted from the exposed part 21s at the boundary of the light transmissive insulating film 17 and the first conductive type layer 21 (exposed part 21s) of the semiconductor structure, specifically, at the boundary of with the insulating film 17 having an index of refraction lower than the semiconductor structure, the first conductive type layer, or the exposed part thereof, the light shielding is suppressed by the electrode forming region covering the same, and the light is suitably extracted from the light window of other exposed parts, side surface of the semiconductor structure, upper surface of the light emitting structure, and the light transmissive substrate etc. by being substantially totally reflected at greater than or equal to a critical angle without light loss by the light reflection of high reflectance at the boundary of the insulating film on the front and the semiconductor.

Figure 5B:
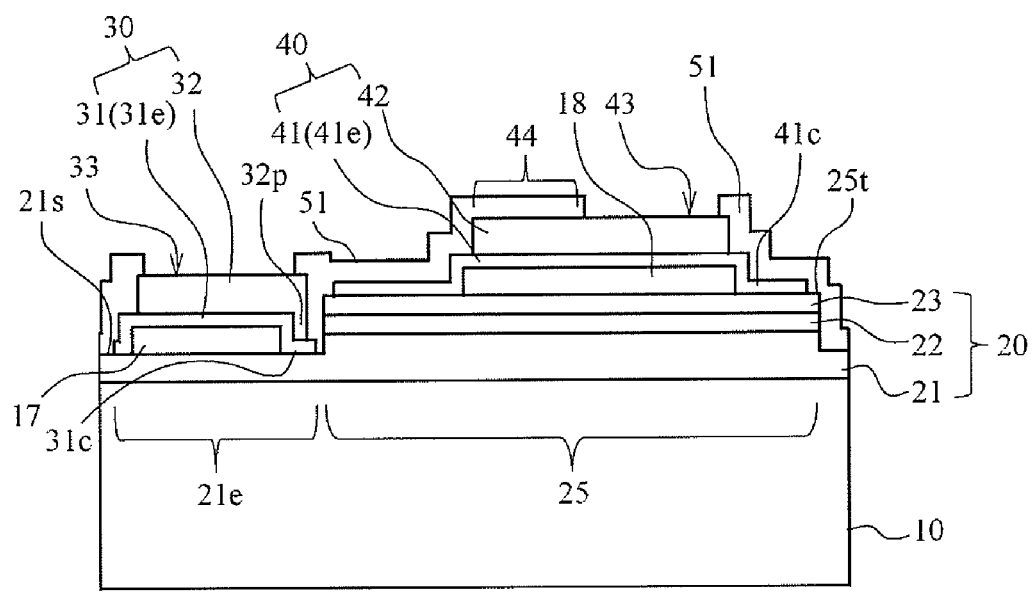
FIG. 5B is a schematic cross sectional view taken along line A-A of FIG. 5A.

As shown in FIG. 5B, the first electrode 30 has the first layer 31 the light transmissive conductive film arranged on the lower layer side including a covered part 31c extending to the outer side from the translucent insulating film 17 and being connected to the first conductive type layer. A structure stacked with a second layer 32 including a reflective metal film on the upper layer side is adopted, where a projected part 32p of the second layer projecting over the covered part 31c is arranged on the outer side of the insulating film 17. In the first electrode 30, a suitable ohmic contact is realized with the first conductive type layer by the projected part 32p. For instance, the contact resistance and the forward voltage can be reduced compared to when formed spaced apart from the covered part 31c, as shown in FIG. 9, and in particular, suitably functions when the insulating film interposing region occupying the electrode is large and the semiconductor layer connecting region is small as in a structure of when the area and the cross sectional width of the translucent insulating film are larger than the covered part 31c or the sum thereof, or when larger than the covered part of the second layer covering the insulating film, as shown in FIGS. 5 and 7, and according to such structure, the reflecting function can be enhanced, and the light retrieval efficiency, the light emitting output, and the power efficiency can be increased.

The portion for covering the insulating film of the second layer is not particularly limited, when arranging the external connecting part 33 thereon as shown in FIG. 5, the external connecting part is formed to a wider cross sectional width compared to other portions such as the electrode elongated part 34 of FIG. 11, and the external connecting part is arranged on the second layer portion covering such insulating film as large area is required, whereby suitable light reflection is carried out at the external connecting part of wide width and large area, and excellent impact resistance in time of external connection and adherence with the first layer and the translucent insulating film of the lower layer are achieved.

As shown in FIGS. 2, 5, 7, 9, and 11, the first layer preferably has a structure including an extending part 31*e* that covers one part of at least the translucent insulating film and a covered part 31*c* extending to the outer side thereof for suitable adherence and connection with the second layer. The first layer is interposed between the second layer and the translucent insulating film, preferably, between the second layer and the translucent insulating film and the semiconductor layer, and more preferably, included in the first layer within the electrode forming surface or arranged with the send layer end on the first layer end, in particular, the inner side of the end of the covered part at the cross section, so that the lower surface side of the second layer is covered with the first layer thereby obtaining further effect.

In this manner, when arranging the first and second electrodes as well as the first and second layers thereof in substantially the same structure and in the same steps, that is, when the first layer and/or the second layer have substantially the same film thickness and are formed in the first and second electrodes, and the translucent insulating film is also the same, each electrode and element function can be enhanced by the different portions of the first and second electrodes, to be hereinafter described.

Most of the structure of the first electrode and the configuration thereof are applicable to the second electrode, but are differed to synergistically enhance the element function, which difference will be described below.

The example of FIG. 5 has a structure in which the light emitting structure portion is formed in the semiconductor structure 20 to have a wider cross sectional width and a larger area than other regions, for example, the non-light emitting portion such as the exposed part and the electrode forming region, where the electrode forming surface side is set as the light retrieval side, in which case, the light retrieving window is formed on the electrode forming surface side of the light emitting structure portion, and the translucent conductive film of the first layer is formed in the window region. In the first electrode of the non-light emitting portion, the light quantity is small compared to the light emitting structure portion, and thus light retrieval through the first layer decreases. Therefore, in the second electrode, the second layer has a smaller cross sectional width and area than the covered part of the first layer, where it is preferable to suppress light shield and light loss by the projected part by being arranged spaced apart from the covered part 41*p*, and more preferably to be included on the translucent insulating film by arranging the second layer end on the inner side of the end of the translucent insulating film as in the example of FIG. 5 than to enhance electrical properties as a structure arranged with the projected part on the covered part as shown in FIG. 7. Thus, in the structure of the example of FIG. 5, it is preferable to have each forming region of the second layer and the translucent insulating film as a light reflecting region, the covered part of the first layer as the light retrieving window region, and as a structure enhancing the function thereof.

Specific examples of the first and second electrode structures include a structure in which the first and second electrodes are arranged by way of a translucent insulating film that at least overlaps one part thereof, and the covered part of the first layer has the projected part 32*p* of the second layer 32 on the covered part 31*c* at the first electrode 30, and the second layer 42 arranged spaced apart from the covered part 41*c* at the second electrode 40, preferably, a structure in which the second layer 42 is arranged included in the translucent insulating film in plane on the inner side of the end of the translucent insulating film at the cross section. Therefore, a structure in which the covered part and the second layer of the first electrode overlap each other to enhance the electrical properties, the second layer is arranged on the translucent insulating film spaced apart from the covered part in the second electrode to suitably function the light retrieving window region of the covered part of the first layer, and the second layer region functions as a reflecting region for suitably reflecting the light reaching the light shielding member by interposition of the translucent insulating film is obtained.

Configurations other than the above will be described below. As described above, the first layer and the second layer are overlapped at least partially and are electrically connected, and the second layer and the translucent insulating film are also overlapped at least partially, but in addition, in the example of FIG. 5, the first layer and the second layer (covered part) are preferably overlapped at least partially on the translucent insulating film in terms of adherence and electrical property. In this case, a structure in which the second layer covers only one of the insulating film or the first layer is preferable than a structure in which the second layer covers the insulating film and the first layer since the interface of the heterogeneous material becomes one, and furthermore, the second layer is more preferably formed only on the first layer.

Each layer of the electrode extending to the outer side of the translucent insulating film is preferably arranged with the electrode part extending to one part of the outer periphery on one side at the cross section or within the electrode forming surface, preferably, the electrode part extending to both sides at the cross section or substantially the entire outer periphery, in particular, the covered part of the first layer in at least the translucent insulating film.

The first electrode elongated part is not arranged in the example of FIG. 5, but similar elongated part 34 may be arranged for the first electrode, as shown in the example of FIG. 11. In this case, as apparent from FIGS. 6, 11, and 15, the elongated part 34 of the first electrode has a shape in which the first and second layers are both extended, as opposed to the second electrode. In the cross sectional view of FIG. 5B, the first layer of the first electrode is shown as a continuous film covering the end and the side surface of the translucent insulating film, but is separated by the insulating film, and furthermore by the film thickness of the first layer, near the end or the side surface of the insulating film with the manufacturing method, that is, the portion covering the translucent insulating film and the covered portion are spaced apart. Preferably, adherence with the second layer becomes satisfactory by configuring with the continuing film as shown in the figure.

As shown in FIG. 5, the insulative protective film 51 arranged in the semiconductor structure may be formed on the electrode, in particular, the first layer may be formed sufficiently thin at the first layer portion exposed from the second layer, specifically, at least one part of the covered part and on the second electrode side, to realize a suitable light reflecting and retrieving structure. Specifically, as shown in the figure and as described in the first embodiment, a film thinner than the translucent insulating film providing the reflecting function is formed, and is formed thinner than the exuding amount of light to form a light reflecting surface at the boundary of the semiconductor structure and the protective film. In particular, similar to the translucent insulating films 17, 18, the translucent protective film 51 preferably has an index of refraction smaller than the semiconductor structure, specifically, the semiconductor layer of each conductive type formed in the electrode. Similar to the first embodiment, $n_s > n_1$ is preferably met, $|n_s - n_1| < |n_s - n_2|$ is more preferably met, and $n_s > n_1 > n_2$ is most preferably met. Accordingly, the total reflection angle can be appropriately adjusted, and specifically, suitable light retrieval is achieved compared to the light reflecting region of the translucent insulating film at the boundary of the protective film and the semiconductor structure at the first layer of the light retrieving window region.

EXAMPLE 3

The light emitting element shown in FIG. 5 is manufactured similar to example 1 (first embodiment) other than that the translucent insulating film is arranged on both the first and second electrodes. The first insulating film 17 is arranged with the same step as the second insulating film 18.

Fourth Embodiment

In the present embodiment, the third embodiment (FIG. 5) differs in that the second layer is formed at substantially the same width, shape and position as the light transmissive insulating film in the first electrode and in that the cross sectional width of the light transmissive insulating film under the second layer is made short and one part is formed as the projected part projected over the first layer in the second electrode, as shown in FIG. 2. In this example, the second layer (projected part) is formed without arranging the light transmissive insulating film at the elongated part 44 of the second electrode 40, and thus a structure in which the light transmissive insulating film 18 is arranged only at the region of the external connecting part, as shown in the figure is obtained.

Compared to the third embodiment, the second layer is formed spaced apart from the covered part of the first layer and substantially included in the translucent insulating film in the first electrode, and thus light absorption and loss reduces by the projected part, but contact resistance with the first conductive type layer tends to increase. In the second electrode, the area of the first covered part of the first layer, and furthermore, the light emitting area increases, but light absorption occurs at the electrode elongated part 44, and as a result, the output tends to lower. Therefore, the power efficiency tends to lower due to increase in Vf at the first electrode and increase in light loss at the second electrode. In the example of FIG. 2, the light emitting element of example 1 (1A to 1C) and comparative example 1 is obtained, and the element characteristics enhance by arranging the translucent insulating film 17 in the first electrode.

Fifth Embodiment

Figure 15:
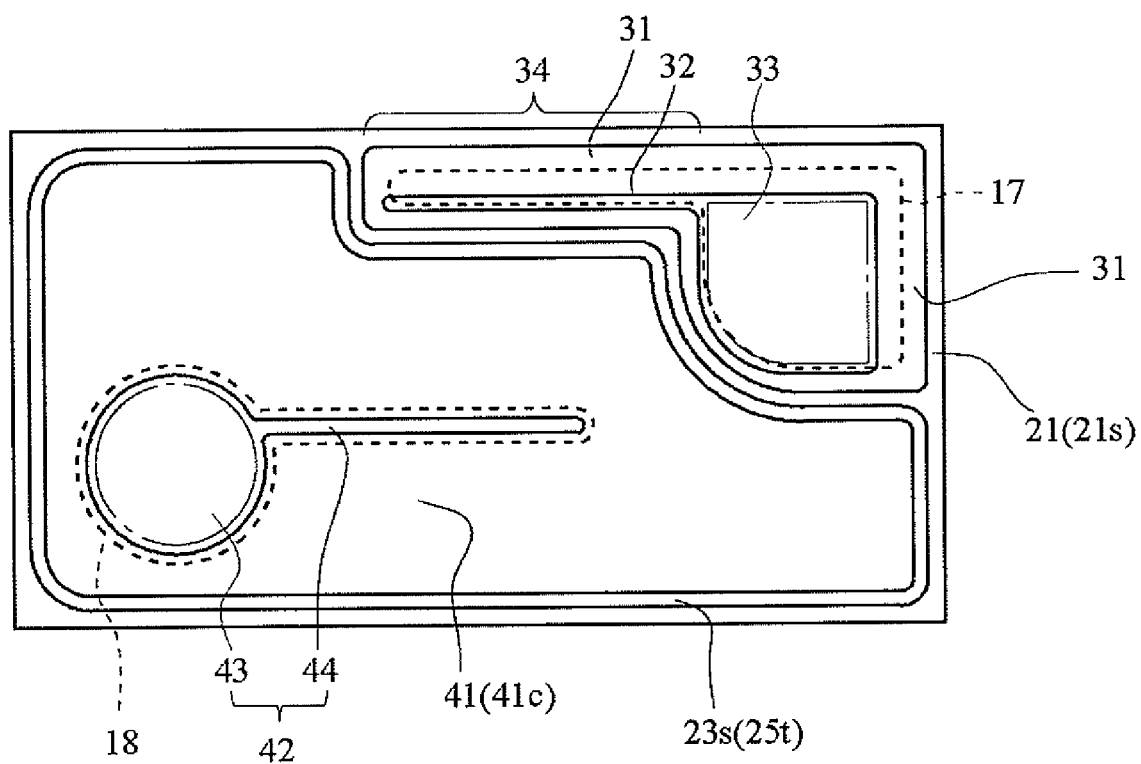
FIG. 15 is a schematic plan view of the light emitting element according to one embodiment of the present invention.

The fifth embodiment has a structure in which the size of the LED is a rectangular shape of 420 μm×240 μm, as shown in FIG. 15, compared to the substantially square LED shape of a specific example (FIG. 5) of the third embodiment. Similar to the third embodiment, the semiconductor structure is formed, the light emitting element structure, the projection, and the electrode forming region are formed, each electrode is arranged, and substrate division is performed.

A concave-cut part of the light emitting structure 25 which is the forming region 21*e* of the first electrode 30 is arranged on one end side in the longitudinal direction with respect to the region of the rectangular light emitting element and the light emitting structure as a corner of the light emitting structure. As opposed to the examples of FIGS. 3, 4, and 5, the electrode forming region 22*e* has a shape in which one part of the light emitting structure is arranged extending to one part of the side surface of the electrode in the longitudinal direction. The first electrode and the second electrode, includes elongated parts 34, 44 extending in the longitudinal direction from the external connecting parts 33, 43 near both ends in the longitudinal direction serving as base points, respectively, where the respective elongated part is arranged facing each other in the width direction so as to sandwich the light emitting structure. The elongated part of the first electrode is arranged adjacent to the light emitting structure, and the other elongated part is arranged up to the position spaced apart from the base point of one electrode in the longitudinal direction. The region of the first electrode elongated part 34 has a structure in which the width of the light emitting structure is formed narrower than the width of the region on the outer side thereof in the longitudinal direction and depressed towards the inner side. Satisfactory current spread in the longitudinal direction of the light emitting structure is achieved by the elongated part.

EXAMPLE 4

In example 1, the light emitting element is similarly manufactured other than being formed as an element structure of FIG. 15 and that the second layer of each electrode is a Ag reflecting electrode of Ni(0.6 nm)/Ag/Ni/Ti/Pt/Au. The element having characteristics as in table 5 below is obtained by manufacturing the first electrode in which the second layer and the light transmissive insulating film are substantially the same shape similar to example 1 (example 4A), in which the first light transmissive insulating film 17 is omitted (comparative example 4), and so as to be displaced to approach the second electrode/light emitting structure portion in the opposing direction of the electrode elongated part (downward direction in the figure), the displaced amount being the distance between the end of the projected part of the second layer and the end of the light transmissive insulating film end of the first electrode of 2.4 μm (example 4B), and 6.7 μm (example 4C). The evaluation in table 5 is the characteristic obtained by mounting on the light emitting device of FIG. 13B similar to table 1. Compared to example 4, similar to the case of example 1, Vf tends to increase from the relationship of the contact area of the first layer, but can be reduced by increasing the displacement amount and can be reduced to the same extent (example 4C). Therefore, increase in Vf can be suppressed by having the cross sectional width of the projected part of the second layer to be greater than or equal to 3 μm, and preferably, greater than or equal to 5 μm, and a suitable light reflecting structure can be realized at the region (electrode elongated part [cross sectional width of about 20 μm], external connecting part [cross sectional width of about 100 μm] of the second layer) occupying most of the other parts. Furthermore, the light flux can be increased by 3% (example 5A), and 6% (examples 4B, C) compared to comparative example 4, and the power efficiency can be enhanced by about 0.5 to 2.5%.

TABLE 5

|  | Vf[V] | $\phi_e$[mW] | W.P.E[%] | $\lambda_d$[nm] |
|---|---|---|---|---|
| Example 4A | 3.24 | 28.0 | 43.2 | 454.9 |
| Example 4B | 3.21 | 28.6 | 44.5 | 454.0 |
| Example 4C | 3.16 | 28.6 | 45.3 | 453.9 |
| Comparative example 4 | 3.18 | 27.1 | 42.6 | 454.5 |

From the knowledge of example 1 and example 4, the light flux can be enhanced by about 15% and 5%, and the power efficiency can be enhanced by having the first and second electrodes as structures including the light transmissive insulating film and first and second layers of the present invention compared to when the light transmissive insulating is not arranged in each electrode and when the structure similar to the present invention is adopted for the second electrode.

Sixth Embodiment

Figure 6B:
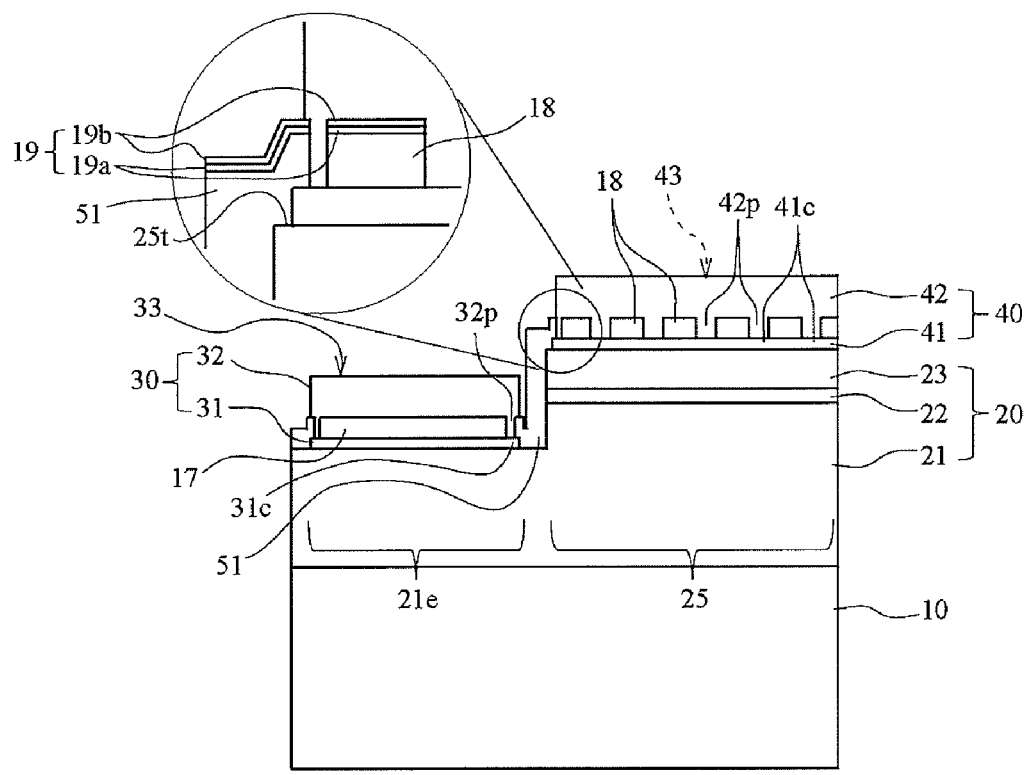
FIG. 6B is a schematic cross sectional view taken along line A-A of FIG. 6A and a partially enlarged view enlarging one part thereof.

The sixth embodiment has a structure in which the electrode forming surface side of the semiconductor structure is the light reflecting side, and the opposing surface side is the light retrieving side, as shown in FIG. 6, different from the first to the fifth embodiments. In the example of FIG. 6, an example of such reflecting element structure in the present invention is shown. FIG. 6A is a schematic plan view of the electrode forming surface side of the light emitting element, and FIG. 6B is a schematic cross sectional view taken along line A-A of a partial region of the element of FIG. 6A. The external connecting parts 33, 43 of the first and second electrodes 30, 40 are shown as a surrounding thin line of chain dashed line in FIG. 6A, where the projected part 42p of the second layer 42 of the second electrode 40, and the insulating film opening corresponding thereto are shown as a square in FIG. 6A. The dimension of the light emitting element of this example is a substantially square having an outer shape of the element of 1 mm×1 mm. The dimension of other structures such as the external connecting part of each electrode is the dimension similar to each of the above example excluding the light emitting structure and the elongated part accompanied therewith related to the size of the element.

Other differences include having an interposed part in which the first layer is arranged under the translucent insulating film and the second layer is conducted to the first layer at the projected part on the outer side of the translucent insulating film while covering the translucent insulating film. A structure in which the first layer and the covered part divided by the translucent insulating film in the examples of each embodiment described above are connected to each other by the interposed part of the first layer interposed between the translucent insulating film and each conductive type layer. Accordingly, the dependency is lowered for the shape etc. of the translucent insulating film to realize a suitable current diffusion by the first layer.

In the second electrode 40, an opening is formed in the translucent insulating film interposed between the second layer and the first layer, the opening serving as conductive parts (41c, 42p) between the first and second layers as a reflecting structure covering substantially the entire surface of the light emitting structure portion 25. The shape of the translucent insulating film is not particularly limited, but a plurality of translucent insulating films is arranged and the projected parts of the second layer are arranged at the opening in at least the cross section. A structure in which each projected part is connected and coupled to each other is obtained at the covered part covering the translucent insulating film. As shown in FIG. 6A, the structure in the electrode forming surface includes an opening, specifically, a plurality of openings separated from each other in the translucent insulating film. In other examples, the island part of the translucent insulating film separated from each other on the light emitting structure portion 25 and the first layer 41, specifically, the island parts and the exposed part of the plurality of insulating films separated from each other can be employed. The shape and the arrangement of the island part of the insulating film, and the exposed part and the opening of the insulating film separated from each other are not particularly limited. In addition to the rectangular shape as shown in the figure, various shapes such as circle, polygonal, ellipse, band shape, stripe shape, lattice shape, and the like can be taken. The arrangement may be an irregular arrangement other than a periodic arrangement on the light emitting structure portion 25 and the first layer 41, as shown in the figure, and various shapes and arrangements are adopted to obtain the desired reflecting characteristics. Preferably, the insulating film has a wider width at the cross section and a larger area at the main surface of the semiconductor structure and the electrode forming surface than the opening or the exposed part thereof, specifically, the first layer covered part 41c covering the same and the projected part of the second layer 42p projected thereon, as shown in FIGS. 6A and 6B. Accordingly, a suitable reflecting structure is obtained by increasing the proportion the reflecting region of the insulating film 18 occupies. The second electrode 40 is preferably arranged with the covered part covering the insulating film than having the second layer separated and exposed at one part on the translucent insulating film. Therefore, the light reflecting external connecting part is suitably arranged at the covered part. Specifically, the covered part is arranged on the insulating film 18 so that the plurality of projected parts of the second layer 42p arranged at the cross section are mutually connected to each other, as shown in the figure. The covered part is preferably arranged so as to cover the insulating film between the projected parts. More specifically, the opening of the insulating film arranged between the first and second layers become the communication part between each layers, and such portion is filled with the projected part extended from the second layer. Such light emitting element has the external connecting part 43 such as a solder bump arranged on the second layer covering the light emitting structure portion, and is adhered to the mounting part etc. of the light emitting device by way of the conductive adhering member. The description has been mainly made on the second electrode, but is the same for the first electrode.

At the projected part 32p, 42p of the second layer 32, 42 of each electrode 30, 40, the area in the electrode forming surface of the projected part of the second electrode or the width in the cross section of the semiconductor structure is made larger than the first electrode. Suitable current injection is carried out to the interposed part of the first layer of the second electrode, in particular, to the first layer arranged in layers on the upper surface of the light emitting structure portion, suitable current spreading by the interposed part and the injection to the semiconductor structure is carried out, so that suitable light reflection by the insulating film is realized. In the first electrode, suitable contact and current injection are performed at the projected part and the first layer covered part immediately below, and the current injecting part is reduced, the insulating film part is enlarged, and the light emitting structure portion is enlarged by having the first electrode smaller than the second electrode. In this case, suitable current injection is carried out by preferably arranging the projected part on both sides of the insulating film, and more preferably, at the portion adjacent to the light emitting structure portion and furthermore on the entire region of the outer periphery of the insulating film at the cross section, as shown in FIG. 6B. As shown in FIG. 6A, the extended length of the projected part of the first electrode in the electrode forming surface is made longer than the projected part of the second electrode. The number of the projected part of the first electrode is made larger than that of the second electrode, thereby suitably enhancing the function of electricity, light emission, and reflection.

In this example, as also seen in the second electrode of FIG. 7, both the interposed part and the covered part are set as light emitting regions on the current injecting part and the light emitting structure portion at the same extent as the contact resistance and the covered part with each conductive type layer at the interposed part of the first layer. The contact resistance is made higher than the covered part so as to obtain a weak light emitting region in the current suppressing part and the light emitting structure portion compared to the covered part. Furthermore, the contact resistance may be made higher to obtain a non-light emitting region in the current blocking part and the light emitting structure portion. As in the present embodiment, in the element having the surface side facing the electrode forming surface as the light retrieval side, the former current injecting part (light emitting region) is obtained so that suitable current injection to the light emitting structure portion on one side or preferably both sides of the exposed part of the first electrode formation. On the light emitting structure portion and the second electrode thereof, the entire first layer forming region is made the light emitting region, and thus the current injecting part of the interposed part is preferably arranged at least on one side, preferably, on the first electrode side, and more preferably, on both sides with respect to the first layer covered part.

Specifically describing such structure, the contact resistance with each conductive type layer is made the same extent as the contact part (covered part) on the outer side at the interposed part of the first layer, as shown in FIGS. 6 and 7. Both the interposed part and the outer contact part may be the light emitting regions on the light emitting structure portion. The above current injecting structure is suitably used in an element having the surface side facing the electrode forming surface as the light retrieval side. The structure with weak light emitting region, high resistance part, and current blocking part at the interposed part is suitably used in an element having the second electrode forming side as the light retrieval side, similar to a structure in which the interposed part is not arranged and the insulating film is arranged contacting the light emitting structure portion. Due to the step difference of the insulating film by arranging the interposed part, the relevant portion is electrically connected in place of the interposed part with respect to the electrical insulation of the external connecting part and the elongated part, to suitably obtain potential difference and current spreading in plane. When the insulating film is contacting, it is preferable to prevent light absorption by the first layer and enhance effect of the insulating film reflecting mechanism. The interposed part may be entirely arranged, arranged partially overlapping, or partially separated under the insulating film. The interposed part may be entirely arranged to communicate the covered parts on both sides, thereby lowering the potential difference on both sides and enabling even current injection.

The control of contact resistance at the first layer 41 (31), in particular, the covered region and the interposed region thereof is carried out by thermal treatment annealing of the electrode, as described in the manufacturing method of example 1. Specifically, in the above example, the electrode (second layer) and the translucent insulating film covering the first layer are covered and subjected to thermal treatment on the p side layer of the light emitting structure portion side, so that suitable contact resistance reduction is obtained at the region exposed from the covered part (first layer covered region) than at the insulating film covered region, and for instance, the contact resistance of the first layer of the interposed region is made higher than the first layer covered region to obtain the current control structure. In forming the first layer, the entire region is thermal treated as exposed region, so that a substantially even contact is realized in plane, and the covered region of the electrode, the insulating film and the like are formed thereon to obtain a structure having the first layer forming region including the interposed region as the current injecting region. Furthermore, in the second electrode, the second layer and the translucent insulating film covering the first layer are covered and subjected to thermal treatment, so that suitable contact resistance reduction of the first layer is obtained at the second layer covered region (projected part 32p) than in the region exposed from the second layer. The first layer covered region 31c under the projected part 32p of the second layer shown in FIG. 6 realizes suitable reduction by the interposed part, and various current control structures can be formed using the same. In the first electrode, the contact resistance control of the external contacting part at the projected tends to be stronger than the contact resistance control of the interposed part and the external contacting part, and the current injection control is preferably carried out while controlling the arrangement and the width of the external contacting part (covered part) with respect to the interposed part.

Furthermore, as shown in a partially enlarged view of FIG. 6B, the reflecting structure of the dielectric multi-layer film 19 may be formed on the upper surface side of the translucent film as a reflecting film structure. The light quantity reaching the second layer 42 made of metal etc. is thereby reduced and the light loss is reduced. The dielectric multi-layer film is a dielectric multi-layer film DBR in which at least two substances selected from at least one type of oxide or nitride selected from a group consisting of Si, Ti, Zr, Nb, Ta, Al are repeatedly stacked. In this case, the reflecting layer 19 is configured by a structure in which at least a pair, and preferably, two or more pairs of films 19a, 19b having a low index of refraction and a high index of refraction such as ($SiO_2$/$TiO_2$, $SiO_2$/$Nb_2O_3$) are alternately stacked.

The dielectric multi-layer film reflecting structure may be arranged on the first electrode, which is preferable since suitable light reflection and light retrieval on the opposite side (substrate side) are realized at the electrode forming region of the non-light emitting structure portion. In this case, each insulating film and the multi-layer film reflecting film are formed in the same step in the first and the second electrodes. As shown in the figure, the multi-layer film reflecting film may be arranged on the protective film 51, which is preferably since suitable light reflection and light retrieval on the opposite side can be realized at the electrode exposed region exposed form the electrode other than the (first and second) electrode forming regions. In place of or in addition to the multi-layer film reflecting film, a metal reflecting film may be arranged, or such metal reflecting film may be used for the lowermost layer of the second layer.

The above described structure and each component thereof are applicable to the first to the fifth embodiments.

Seventh Embodiment

In the seventh embodiment, in the second embodiment and the examples 2, 5, a light emitting element of substantially a square (320 μm×320 μm) is manufactured similar to examples 2 and 5 other than that the shape of the elongated part 44 of the second electrode (p electrode) is as shown in the second embodiment and the examples 2, 5, the number of elongated part is changed from four (examples 2, 5) to two, the translucent insulating film 18 corresponding to the elongated part (second layer) and the electrode shape is arranged, the second layer of the first electrode is arranged so as to be included in the translucent insulating film 17 as shown in FIG. 9, and the exposed region 21s of the peripheral edge of the element is made to a wide width. With reduction in the number of elongated part 44, the width thereof is made wider than in the example of FIGS. 1 and 4, or about 20 μm in example 7.

In this light emitting element, since the number of electrode elongated part is reduced, the area of the translucent insulating film 18 occupying the element region becomes smaller, and the light emitting area becomes larger, but due to reduction in the number of electrode elongated part 44 and reduction in the area of the peripheral edge, the current spread tends to lower and the output tends to lower.

As shown in FIG. 3, this embodiment has a structure in which the first electrode also includes the insulating film forming region similar to the second electrode, and specifically, the translucent insulating film 17 is interposed in the first electrode 30, and the second layer 32 and the first layer extending part arranged between the second layer 32 and the insulating film 17 are arranged. Therefore, in the present invention, the structure similar to the second electrode can also be applied to the first electrode, and an element of higher output, higher efficiency, and higher power efficiency can be obtained by such combined structure.

EXAMPLE 5

A light emitting element is similarly manufactured other than having the electrode shape shown in FIG. 3 in example 2. A comparative example 5 has a structure in which the translucent insulating film is omitted compared to example 7. Different from the structure including the second layer 32 and the first layer extending part with the translucent insulating film 17 interposed in the first electrode 30, as shown in FIG. 3, a shape similar to the first layer shown is formed with the n electrode of Ti/Rh/Au in this example similar to the examples 1, 3. Compared to comparative example 6, an element of higher output, higher efficiency and higher power efficiency is obtained.

Eighth Embodiment

As shown in FIG. 11, the eighth embodiment has a light emitting structure in which two of the electrode forming region 21e and the first electrode 30 are arranged inside the light emitting structure 25, where the first electrode is arranged between each of the plurality of light structure portions 25. Therefore, a structure in which a longitudinal light emitting structure portions 25A and 25B, specifically, inner light emitting structure portion 25A and two outer light emitting structure portions 25B are alternately arranged with the first electrode 30 (forming region 21e) in the width direction. The first and second electrodes 30, 40 have a structure in which including external connecting parts 33, 43 of wide width and a elongated parts 34, 44 of narrow width extending in the longitudinal direction therefrom. A structure including the first electrode 30, and mainly, the elongated part 34 with respect to each light emitting structure portion 25A and 25B is obtained, where suitable current spread and light emission can be realized. FIG. 11A is a schematic plan view of the light emitting element, and FIG. 11B is a schematic cross sectional view taken along line A-A of a partial region of the element of FIG. 11A. The dimension of the light emitting element has an element outer shape of 800 μm×800 μm, and the dimension of other structure such as the external connecting part of each electrode is formed to the dimension similar to each of the above example excluding the light emitting structure related to the size of the element and the elongated part accompanied therewith.

In this example, the electrode forming region 21e has the entire outer peripheral region surrounded by the light emitting structure, and being separable from each other, different from the examples (FIGS. 1, 3, and 4) described above. The electrode structure also has a structure including an elongated part 34 extending in the longitudinal direction of the light emitting structure portion 25A and 25B with the external connecting part 33 as the base point. Similar to the second electrode 40 (upper layer 42), the elongated part 44 extending in the longitudinal direction of each light emitting structure portion is arranged facing each other with the alternately arranged light emitting structure portions 25A and 25B in between at the first electrode and the extending part thereof.

In this example as well, the electrode structure of the present invention suitably functions, and similar to the above embodiment, a suitable light reflecting structure can be obtained at the electrode forming region 21e of the exposed part 21s surrounded by the light emitting structure portion in the closed electrode forming region 22e as well. A structure suitable light retrieving from regions other than the above is also obtained. The present invention is suitably applied to the light emitting element structure in which each electrode and the elongated part thereof or the external connecting part and the light emitting structure portion are arranged in plurals.

An element shown in FIG. 12 having an outer shape of 450 μm×450 μm will be described as a variant of the element of large area as in the present embodiment. As in the example of FIG. 11, the element can be understood by partitioning a plurality of light emitting structure portions sandwiched by the elongated parts of the first and second electrodes. The first electrode structure is the electrode structure of the present invention, and a light emitting device of 150 l m/W can be obtained.

Each embodiment and each configuration in the present embodiment will be described in detail below, but are not limited thereto, and each configuration may be appropriately combined. Each embodiment, and each configuration as well as component described therein may also be appropriately combined.

(Semiconductor Structure/Element Structure/Light Emitting Structure)

In the structure of the light emitting element, a semiconductor structure 20, specifically a layered structure having each of the semiconductor layers stacked is provided on a substrate as shown in FIG. 1 and the like. A structure without having a substrate, which is obtained by removing the substrate and the like, a structure without having a semiconductor layer such as an underlayer 21 other than active region of the element, an element region or structure provided with a conductive region in the substrate such as a semiconductor substrate, may also be employed. In addition to and different from the electrode arrangement shown in FIG. 1, the first and second electrodes may be arranged on the opposing main surfaces with the semiconductor structure in between. The light emitting structure preferably has such active layer or light emitting layer between the first and second conductive type layers. Also, a structure having a p-n junction as the light emitting part, a light emitting structure having a p-i-n structure, a MIS structure and the like may be employed. In addition, a semi-insulating or insulating portion, an i-type layer, or a reverse conductive type layer or region may be provided to a part of element structure or each conductive type layer. For example, a current blocking layer or region formed with such as a semi-insulating or insulating portion, or an i-type layer, a reverse tunneling layer formed with a reverse conductive type for contacting with an electrode, may be provided to the structure.

A semiconductor to serve as the light emitting structure 25, e.g. a later-described nitride semiconductor of a specific example in FIG. 1, is formed by a growth method such as MOVPE (metal-organic vapor phase epitaxy). Examples of a growth substrate of the nitride semiconductor may include a sapphire (C-plane, A-plane, R-plane), a spinel ($MgAl_2O_4$), NGO ($NdGaO_3$), $LiAlO_2$, and further, a semiconductor substrates such as Si, SiC, GaN, or the like. Examples of the growth method may include MOVPE and MOCVD (, and further, HVPE and MBE. The substrate is preferably a foreign substrate made of material different from nitride semiconductor, and more preferably a light transmissive substrate, since making the element structure where the first and second electrodes are formed on the same plane excellent in light extraction. For example, a sapphire substrate and spinel substrate can be used. In using a substrate with poor optical transparency, e.g. a semiconductor substrate and a metal substrate, the device structure may be formed such that a light reflection layer is provided between the substrate and the semiconductor. A nitride gallium-based compound semiconductor material is preferably represented by a general formula $In_xAl_yGa_{1-x-y}N$ (wherein $0 \leq x \leq 1$, $0 \leq y \leq 1$, and $0 \leq x+y \leq 1$), and as described later, a binary mixed crystal or ternary mixed crystal thereof can be suitably used. Further, as for a nitride semiconductor of each conductive type, the n-type nitride semiconductor is added with, as n-type impurities, one or more of the IV group elements, and the VI group elements and the like, such as Si, Ge, Sn, S, O, Ti, Zr and Cd, desirably Si and Ge. The p-type nitride semiconductor layer contains Mg, Zn, Be, Mn, Ca, Sr or the like as p-type impurities. Besides the nitride semiconductor, this can also be applied to other semiconductor materials such as a GaAs- or GaP-based compound semiconductor, and an AlGaAs- or InAlGaP-based compound semiconductor.

[Electrode, Electrode Structure]

As shown in the above example, the electrode of the light emitting device 100 is comprised of the second electrode 40 provided on the surface 25t of the light emitting structure and the second conductive type layer 23s and the first electrode 30 provided on the first conductive type layer 22s separated from the light emitting structure 25. The electrode preferably has the electrode of each conductive type arranged on the same surface side of the substrate 10, that is, one main surface side of the semiconductor structure. Not limited thereto, a structure in which each electrode is arranged on the opposing surfaces of a structure, the structure including the semiconductor structure and in addition including the substrate may be obtained. In this case, removing the growth substrate of the semiconductor layer of the above example through polishing and LLO (Laser Lift Off) may be used, where a member having the semiconductor structure removed with the growth substrate as another carrier is used as the substrate may be adopted, in which case, another layer such as a conductive film and a light reflective film is arranged between the carrier member and the semiconductor structure.

Accordingly, the lower layer side (the first layer) of the first and second electrodes on the light emitting structure 25 and exposed portion 21s is formed for ohmic contact. When the lower layer side has a wider width and a larger area than those of the upper layer side as shown in the examples of FIGS. 1, 2, 4, and 5, specifically in the examples of the illustrated the second electrode, it also functions as a current diffusion conductor. Further, a light transmissive conductive film may be used for rendering the light extraction from the light emitting structure desirable. Other than this, a light transparent structure, e.g. a structure of a light shielding member in porous or lattice form, can be used. The first layer 31 on the lower layer side of the first electrode 30 barely has the light retrieving function since the covered region of the first layer is small or is covered with light shielding second layer, and mainly functions for ohmic contact. In a structure in which the exposed region 21s and the light emitting structure 25 are arranged in plane on the first conductive type semiconductor, the current diffusion conductor to the plane is mainly the first conductive type semiconductor region on the lower side of the light emitting structure, different from the first layer 41 of the second electrode serving as a diffusing body. The elongated part 34 of the first electrode 30 shown in the fifth and the sixth embodiments has a function of helping current diffusion of the first conductive type layer when current injected by the projected part even in the elongated part, similar to the relationship of the elongated part of the first and the second layers of the diffusion conductor of the second electrode 40. In each embodiment and the structure in the figure thereof, an example in which the second electrode 40 includes the elongated part 44 is merely shown, but the elongated part may not be arranged, and for instance, can be omitted in a small area or narrow width light emitting structure surface or element, specifically, an element having a width of smaller than or equal to 250 µm.

The first layers 31, 41 of the first and second electrodes 30, 40 are used in the element structure in which the light transmissive film is combined with the light transmissive insulating film to have the first and second electrode forming side as the main light emitting side or as the opposite side to have the opposing side as the main light emitting side. As in the first electrode 30 of FIG. 1C, the first layer may be omitted or the first layer may be non-translucent in the case of the electrode structure in which the translucent insulating film is not interposed between the first and second layers. Examples of the light transmissive conductive film and a p-side electrode of a nitride semiconductor include at least one metal selected from the group consisting of Ni, Pt, Pd, Rh, Ru, Os, Ir, Co, Ag, an alloy and a layered structure thereof, and further, a compound thereof such as a conductive oxide or nitride. Examples of a conductive metal oxide (oxide semiconductor) used for the first and second electrodes include indium oxide doped with tin (Indium Tin Oxide; ITO) having a thickness of between 5 nm to 10 µm, ZnO (zinc oxide), $In_2O_3$ (indium oxide), and $SnO_2$ (tin oxide), a compound thereof such as IZO (Indium Zinc Oxide). Such materials are preferably used because of their advantage in light transmissive properties, and a suitable material is selected according to the wavelength of light. In addition, constituent element of the semiconductor, dopant of the semiconductor, and the like can also be used for a doping material for the conductive materials described above.

As shown in the specific example, the translucent film (first layer 31, lower layer side) of the first and second electrodes 30, 40 preferably has the same material and structure, and more preferably, arranged in the same step, whereby an electrode structure excelling in mass production is achieved. As in the above-mentioned specific example, the metal film/reactive film (second layer 32, pad electrode, upper layer)

arranged on each of the upper layers of the first and second electrodes 30 and 40 is preferably made of the identical material and has the identical configuration, and further, in the identical process. The material selected from the above group (metal including one type of group, metal alloy, stacked structure) is used for the metal film and the reflective film of the electrode. The second layer and the pad electrode on the upper layer side of the first and second electrodes may be a single-layer film, but is preferably a multi-layer film structure. The structure has at least two layers: a reflection layer; and a metal layer for a pad portion/for current diffusion, desirably at least three layers: a reflection layer 32-1 (42-1); a barrier layer 32-2 (42-2); and a metal layer 32-3 (42-3) for the pad portion, in this order as shown in FIGS. 7 to 9. It is preferably a structure having at least three layers to suitably enhance the function of each layer. The structure may include four or more layers including an adhered layer, to be hereinafter described, as shown in FIG. 9, or 32-1 to 32-4 and 42-1 to 42-4 in the figure. As the reflection layer, a material with a high light reflectance with respect to light emission of the element may be used. Specific examples of the material may be Ag, Al and Rh, and Rh is preferably used since being stable. Further, the reflection layer is arranged on the contact side with the light transmissive film (first layer, lower layer side). The barrier layer prevents diffusion in the upper layer (a surface layer or the pad portion) and the lower layer (the reflection layer) and protects the layers. For the barrier layer, a material having a high melting point such as W and Mo, elements of the platinum group, Ni, Au or the like, preferably Pt, W, Mo or Ni, is used. As the material for the pad electrode, Au or Al is used. Although the respective film thicknesses of the layers are not particularly limited, for example, the film thicknesses of the layers are from 0.05 to 5 µm, and formed such that the reflection layer is thinner than other layers (upper layers thereof) and the barrier and pad layers on the upper layer side thereof are relatively thicker than the reflection layer. Further, each of the above layers may be configured using a multilayer film in addition to a single film, or as shown in FIG. 9, the layers are configured such that a protective layer and an adhesion contact layer, such as Ti and Ni, may be interposed between each of the layers and between the first layer and the layers so that the second layer is composed of not less than four layers (32-1 to 32-4, 42-1 to 42-4). Specific examples may include a structure where Rh/Pt/Au, Al/Pt/Au, Ti (thin film adhesion layer)/Rh (reflection)/Pt (barrier)/Au (surface layer), Al (reflection)/W/Pt/Au (surface layer), or Ni (thin film adhesion layer)/Ag (reflection)/Ni/Ti/Au are laminated in this order.

As shown in FIGS. 7 and 8, the second layer may have a cross section of a trapezoidal shape width a wide width on the first layer side in terms of manufacturing, and as shown in the figure, a structure in which the side surface of the light emitting structure side is inclined at the upper side with respect to the light emitting structure side surface adjacent to the second layer of the first electrode is obtained by stacking the upper layer so as to cover the upper surface side surface on the lower layer side, whereby directivity and axial light intensity by light reflecting effect can be enhanced compared to the multi-layer structure shown in FIG. 9. Meanwhile, the second layer may have a structure in a rectangular shape, inverted trapezoidal shape in the cross section, with an inverted inclined plane. A desired shape can be obtained with the conventionally known manufacturing method such as mask material and shape, and film forming condition.

(Protrusion, Optical Structure Portion)

Figure 12:
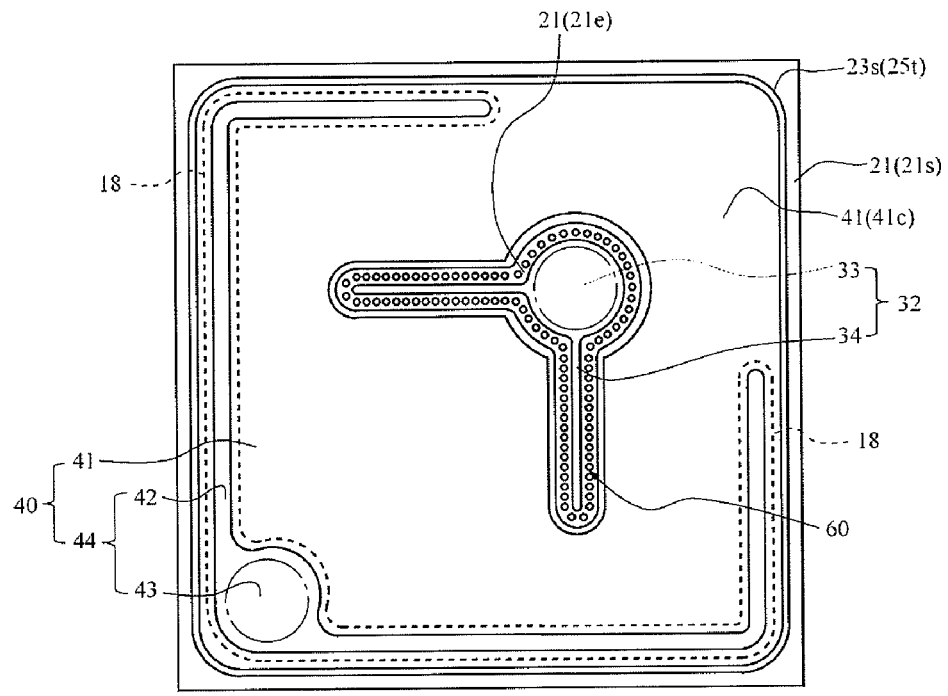
FIG. 12 is a schematic plan view of the light emitting element according to one embodiment of the present invention.

A structure portion such as the protrusions 60 having optical functions such as reflection, scattering and diffraction may be provided to a surface thereof between the first electrode 30 and the light emitting structure 25 as shown in FIGS. 9 and 12, for example, a side surface 61 and 62, a upper surface or the like of a trench or recess 26p, or to a light extracting portion of the semiconductor structure or a surface of substrate. It is preferable because the light extracting efficiency can be improved. A recess/protrusion structure may be provided on a surface of the semiconductor structure in a similar way as the recess/protrusion structure 11 on the surface of substrate 10 as shown in FIGS. 2 and 7. Such optical structure is preferably formed with a light transmissive material with reduced light absorption and loss such as a recess/protrusion structure provided by a protective film 51 on the exposed surface 21s of the first conductive type semiconductor layer. A planar shape and a planar configuration such as circular, elliptic, square or rectangular, parallelogram, triangular, hexagonal or honeycomb shape and lattice is suitably selected to obtain a high density configuration. In addition, the cross-sectional shape thereof may be such as trapezoidal or inverted trapezoidal, rectangular as in a similar way as the second layer of the upper side of the electrode. When the planar shape of these structural components such as a protrusion, recess, and groove has a width of 0.5 to 5 µm, preferably 1 to 3 µm, preferable production can be performed.

[Light Transmissive Member 50, Protective Film 51, Sealing Member/Covered Member 52, Light Transmissive Insulating Film 17, 18]

As shown in FIGS. 1B to 1D, 2, 4, 5B, 7, 8, and 11B, preferably, an opening for opening the external connecting part 33, 43 of each electrode is arranged, and an insulative protective film 51 for covering substantially the entire surface of the other element region is formed. As shown in the example of the light emitting device hereinafter described, the light emitting element is preferably covered with the translucent member 50 such as the covered member 52 for covering the element or the semiconductor structure, or sealed with the sealing member 52. The protective film 51 arranged on the semiconductor structure, in particular, on the electrode forming surface side is preferably made as few as possible. Furthermore, as shown in the figure, it is preferably the translucent member 50 including at least the protective film 51 and the covered member 52 covering the outer part thereof. The protective film is formed with light transmissive material when having the element structure side as the main light retrieving side. As shown in FIGS. 1B to 1D, and 2, the shape of the opening may a shape that opens the upper surface of the electrode, specifically, one part (external connecting part) of the second layer. As shown in FIGS. 7 and 8, a mode of covering the lower layer side (translucent first layer) of the electrode, and arranging the upper layer side (second layer) of the electrode spaced apart from the end of the protective film in the opening may be adopted. A mode of covering the translucent conductive film on the lower layer side formed with a relatively thin film, in particular, a mode of covering at least the first layer covered region is preferable in the present invention. More preferably, a mode of covering at least the insulating film end and the outer edge thereof or the thin film parts 17a, 18a or the boundary region of the covered region and the insulating film region is adopted. The material of the protective film material includes Si, Mg, Al, Hf, Nb, Zr, Sc, Ta, Ga, Zn, Y, B, Ti, and furthermore, compounds thereof such as oxide, nitride, and fluoride, specifically, oxide and nitride of silicon, aluminum, oxide of niobium, and dielectric film, which are conventionally known. The material having high translucency, and desired index of refraction or extinction coefficient k, preferably k=0 is appropriately used according to the wavelength of the light of the light emitting element.

Similar to the translucent insulating film, the region covering the protective film, in particular, the first layer covered part has a film thickness of at least $\lambda/2n_3$, more preferably, greater than or equal to $\lambda/n_3$ in order to enhance the light reflecting function, similar to the translucent insulating film. The protective film and the translucent insulating film may be formed at different film thickness.

In the present invention, the relationship of the index of refraction between each translucent film, specifically, the first layer, the translucent insulating film translucent member, the protective film, and the sealing/covered member and the semiconductor structure is preferably $n_s > n_2$ to obtain a satisfactory reflecting structure. Here, $n_s$ is the index of refraction of the semiconductor structure, in particular, the vicinity of the insulating film forming surface ($21s$, $23s$, $25t$) thereof, and $n_2$ is the index of refraction of the translucent insulating film, where $n_3$ described below is the index of refraction of the translucent member (protective film etc.), in particular the protective film. Preferably, $n_s > n_3$ is met, in particular, the protective film of the first layer covered region to obtain a suitable light reflecting structure at the covered region. Preferably, a suitable reflecting structure is obtained with a mixed structure of the first layer and the protective film in the reflecting region by $n_1 > n_3$.

Furthermore, as shown in the light emitting device of the above examples and the ninth embodiment, $n_{3A} > n_{3B}$ is met with respect to the protective film (index of refraction $n_{3A}$) having the light transmissive member (index of refraction $n_{3B}$) arranged in the semiconductor structure so that a suitable index of refraction distribution to the outside from the first layer is formed on the light path. A suitable reflection is obtained in the vicinity of the interface of the protective film and the sealed/covered member near the upper end of the reflecting region in the reflecting structure of the present invention. From a different standpoint, $|n_s - n_1| < |n_s - n_{2,3}|$ is more preferable, and $n_1 > n_2 > n_3$ is most preferable. Accordingly, the total reflection angle can be appropriately adjusted, the reflectance of the reflecting region can be enhanced, and specifically, a suitable light retrieval is realized at the boundary of the protective film and the semiconductor structure in the first layer covered region of the light retrieving window region compared to the light reflecting region of the translucent insulating film.

The translucent insulating made use material similar to the protective film. The film thickness is not particularly limited, but is about 10 nm to 1 µm, and the film having low index of refraction is preferably greater than or equal to 200 nm as shown in example 2 in terms of light reflecting function. The metal reflecting film may be arranged on the insulating film, specifically, between the insulating film and the second layer or the surface of the insulating film as the reflecting structure, or the reflecting function can be given to the lowermost layer (32-1, 42-1) of the second layer, as described above.

[Examples of Electrode Structure]

Other configurations or other embodiments of each configuration and member of the present invention will now be described using FIGS. 7 to 9. FIGS. 7 to 9 are schematic views showing a cross section of one portion in the light emitting element of the present invention, and particularly describe the light emitting structure portion 25 and the adjacent exposed part 21s, as well as the first electrode forming region 21e arranged therein.

As shown in FIGS. 7 to 9, a structure in which the translucent insulating has a small film thickness at the ends, and a large film thickness on the inner side is preferably adopted to enhance the adherence of the first layer, the second layer, and the protective film of the upper layer at the vicinity of the ends. Specifically, the thin film part is formed on at least one end, preferably, both ends at the cross section, and on at least one part, preferably, the entire outer periphery of the outer edge in the electrode forming surface. Accordingly, the effects are suitably exhibited at the upper layer, in particular, the vicinity of the covered region of the first layer (FIGS. 8 and 9) arranged across the step difference between the insulating film and the surface of the semiconductor layer, and between the covered part and the projected part in the second electrode, in particular, in a mode including the second layer or the first layer bridged over a plurality of insulating film openings as in the sixth embodiment described above in the case of the first electrode (FIG. 8), as shown in FIGS. 8 and 9. Furthermore, as shown in FIG. 9, in the case of the second layer spaced apart from the covered region of the first layer, the division at the step difference can be avoided, and thus is preferable. The optical distribution in the boundary region between the first layer covered region and the insulating film forming region is made smooth, and thus is preferable. Such thing film part is formed through lift of f by the inclination at the end face of the mask, over etching under the vicinity of the end of the mask, and the like.

In the present invention a mode of arranging the translucent insulating film under the electrode, specifically, between the second layer or the first layer and the semiconductor structure has been mainly described in each of the above embodiments and examples. In addition, the first layer (interposing region) interposed between the translucent insulating film and the semiconductor structure, in particular, the insulating film and the light emitting structure portion 25 may be arranged as in the sixth embodiment (FIG. 6) and FIG. 7.

As shown in FIGS. 7 to 9, and FIGS. 2 and 3, the reflecting structure of the second electrode is also applicable to the first electrode. In this case, the second layer may be formed spaced apart from the first layer covered region 31c, as shown in FIGS. 2, 8, and 9, or formed as a structure arranged with the projected part 32p of the second layer in which the second layer 32 is projected over the first layer covered region 31c on the outer side of the insulating film, as shown in FIG. 7. A suitable ohmic contact is obtained with the first conductive type layer, and the contact resistance and the forward voltage can be reduced by arranging the extending part 32p. In the case of the second electrode, a structure effective in ohmic contact is obtained in a mode of not including the projected part and being spaced apart from the first layer covered region 41c, preferably, a mode of being included in the insulating film and spaced apart from the end of the insulating film, which is suited for light extracting structure in the light emitting structure portion described above.

The covered part of the second layer for covering the insulating film is not particularly limited, but if the external connecting part 33, 43 is arranged thereon, as shown in FIGS. 1 and 2, the external connecting part is formed with a wide cross sectional width and requires a large area compared to other portions such as the electrode elongated parts 34, 44 shown in FIG. 11, and thus, the external connecting part is preferably arranged on the covered part so that a suitable light reflection is obtained at the external connecting part of wide width and large area, and excellent impact resistance in time of external connection, and adherence with the first layer and the translucent insulating film of the lower layer are achieved.

The basic structure is a structure in which the first layer and the second layer overlap each other at least at one part and are electrically connected in both the first and second electrodes, and in which the second layer and the translucent insulating film also overlap each other at least at one part. In addition, in the examples of FIGS. 2, 3, and 7 to 9, the first layer (extending part 31e, 41e) and the second layer (covered part 32e, 42e) preferably overlap each other at least at one part on the translucent insulating film in terms of adherence and electrical characteristics. In this case, a mode in which the second layer contact and cover the insulating film and the first layer is adopted, and furthermore, the second layer is preferably formed only on the first layer. Each layer of the electrode extending to the outer side of the translucent insulating film preferably adopts a mode in which the electrode part extending to one side in cross section or to one part of the outer periphery in the electrode forming surface, preferably, the electrode part extending to both sides of the cross section or to substantially the entire outer periphery, in particular, the covered region of the first layer is arranged in at least the translucent insulating film, and furthermore, it is extended to the extending part on the insulating film. If the overlapping of the first and second layers is at the outer side of the insulating film as in the second electrode of the sixth embodiment (FIG. 6B) and FIG. 7, influence of disconnection of the first layer and the like does not arise, and mutual conduction is achieved. In this case, a mode including the first layer extending part on the insulating film as in the first electrode of FIGS. 5B and 7, or a mode including the first layer interposed part as in the first electrode of FIGS. 6B and 7 may be adopted. A mode in which partial or entire interposed part is not formed, partial or entire insulating film contacts the semiconductor, and connects to the second layer at the first layer covered part on one side or both sides of the insulating form may be adopted.

(Arrangements of the First and Second Layers, and the Insulating Film)

Figure 10:
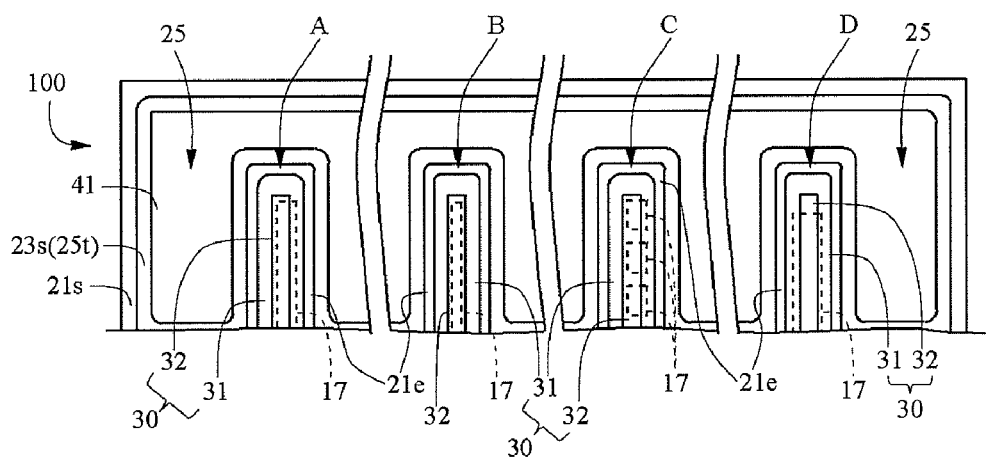
FIG. 10 is a schematic plan sectional view of one part of the light emitting element according to one embodiment of the present invention.

In the present invention, the first layer 31 (41) and the second layer 32 (42) merely need to overlap each other, and various modes may be adopted as a structure of being arranged at one part of the first layer, as shown in FIG. 10. For instance, a mode in which the first layer (solid line in the figure) and the second layer (dotted line in the figure) partially overlap and the second layer extends to the outer side of the first layer (A in the figure); a mode in which the second layer is included in the first layer as described in FIGS. 7 and 9 (B in the figure); a mode in which the first and second layers are separated from each other (C in the figure), a mode in which the first and second layers are shortened in the elongating direction (D in the figure) may be adopted, and modes in which the first layer and the second layer are reversed in such modes may be adopted.

In the mode of A, the insulating film 17 is displaced to one light emitting structure portion side from the center or the electrode forming region 21e, and is arranged so that the distance becomes closer. The current is injected with priority to the light emitting structure portion on the far distance side than the light emitting structure portion on the close distance side. This is because the projected part of the second layer is arranged on the far distance side and the insulating film 17 projecting out from the second layer is arranged on the near distance side. Thus, the second layer, and furthermore, the first layer are arranged at equidistance from the center of the electrode forming region 21e or the light emitting structure portion, and moreover, the first layer covered part is arranged on each light emitting structure portion side. A current control structure of current injecting with priority to the light emitting structure portion on the side arranged with the projected part of the second layer than the non-arranged side or the side in which the cross sectional width of the projected part and the area of the electrode forming surface is small is obtained. In FIG. 15, a structure in which the projected part is arranged on the light emitting structure portion side and not arranged on the element outer edge side, and current is injected with priority to the light emitting structure portion side is shown. In FIG. 11, a structure in which each projected part is formed at substantially equal width in the light emitting structure portions 25A and 25B (25B-1 and 25B-2) sandwiching the elongated part, and more preferable, arranged at substantially equal width at the entire region of the outer periphery of the insulating film, and most preferably, arranged at substantially equal distance at the entire region of the inner periphery of the electrode forming region at the elongated part 33 is obtained, as shown in B of FIG. 10. More preferably, such structures are adopted in the external connecting part 34. Accordingly, a structure for achieving even current and light emission is realized at each light emitting structure portion. The light emitting structure portion sandwiching the electrode forming region has been described, but application can also be made to the light emitting structure portion adjacent to the electrode (forming region). A projected part may be arranged at the end of the electrode elongated part at the connecting part, the connecting part connecting the light emitting structure portion adjacent to the end of the electrode elongated part and each light emitting structure portion sandwiching the elongated part, as shown in D of FIG. 10, and such region may be set as the preferential region. Furthermore, as in the example of C in the figure, the projected part adjacent to the light emitting structure portion on both sides may be distributed and each distributed part may be set as the preferential region. The above description is mainly made on the first electrode, but may be suitably applied to the second electrode by applying the structure of the projected part of the second layer and the elongated part (second layer) as described above.

Ninth Embodiment

Figure 13A:
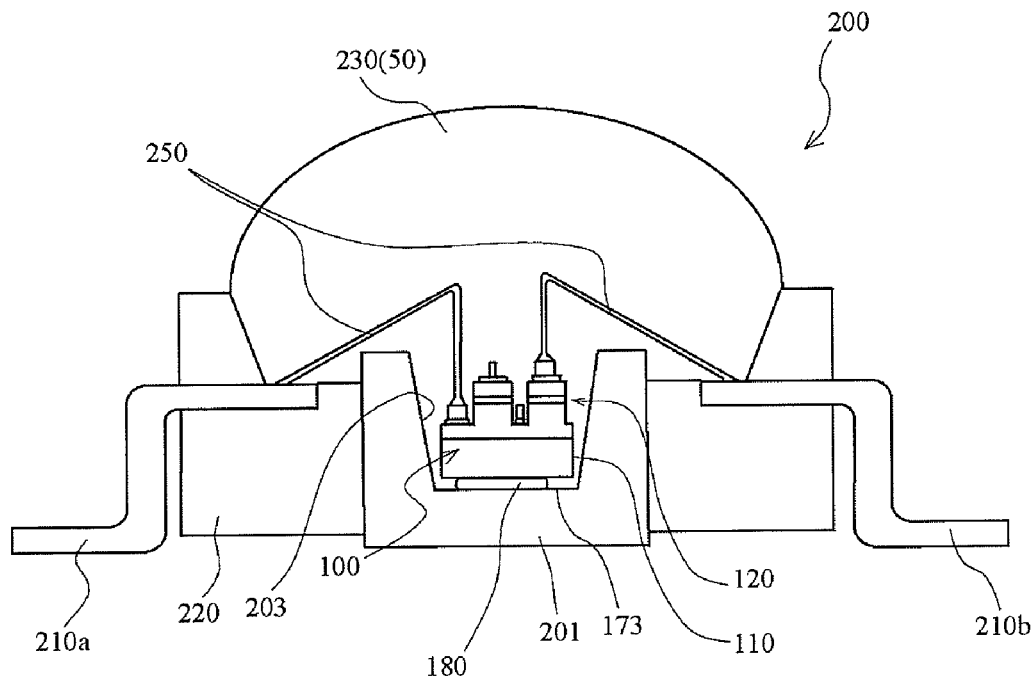
FIG. 13A is a schematic cross sectional view of a light emitting device according to one embodiment of the present invention.
Figure 13B:
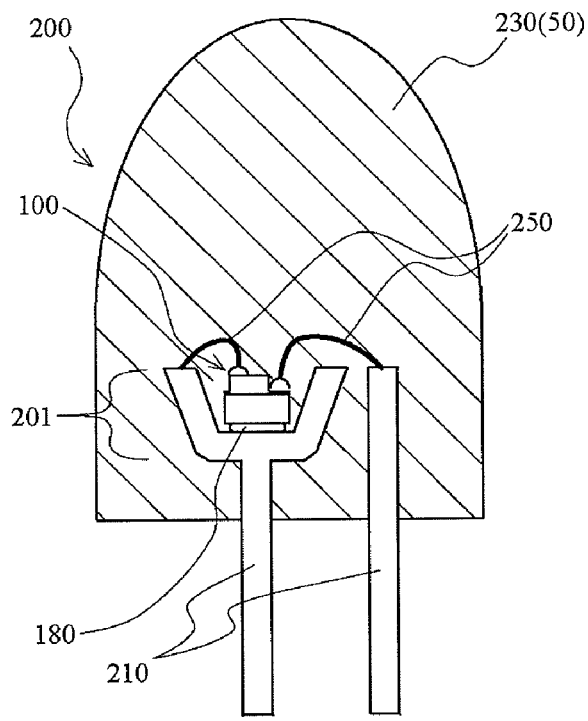
FIG. 13B is a schematic cross sectional view of the light emitting device according to one embodiment of the present invention.

FIG. 13 describes the light emitting device 200. A light emitting device 200 mounted with the above-mentioned light emitting device 100 is described. As shown in FIGS. 13A and 13B, the light emitting apparatus 200 is structured such that the light emitting device 100 is placed on a light emitting device mounting portion 173 of a substrate/region 201 for mounting. Examples of the mounting substrate include a stem 210 for a light emitting element, a ceramic substrate for surface mounting, and a plastic substrate. Specifically, a mounting substrate made of AlN or a substrate made of a metal is preferably used, because a light emitting device having high heat dissipation can be obtained. A mounting surface 173 to be mounted with the semiconductor light emitting element 100 is made of metal material to realize a light emitting device having suitable light directivity for reflecting light extracted to the outside of the light emitting element. The mounting surface where the semiconductor light emitting element to be mounted is made of a metallic material so that the light extracted from the light emitting device is reflected from the mounting surface and a light emitting device having suitable directivity of light can be obtained. At an inner surface of the device where the emitted light reaches, such as a mounting surface having the light emitting element mounted thereon and the reflecting surface 203, a metallic material is used for a lead electrode 210 and the like. Examples of the metallic material include such as Ag, Al and Rh, and a plated film or the like may be formed. In an example of the light emitting device, as shown in FIG. 13, the semiconductor light emitting element 100 provided with a metalized layer 170 such as a reflection layer, eutectic solder, and an adhesive layer 180 on the second main face is mounted on the device mounting portion 173 of the substrate of the apparatus, a housing 220 by thermal compression bonding or the like via the adhesive layer 160. Further, the device is structured such that lead electrodes 210(*a, b*) of the light emitting device 200 are connected to the respective electrodes 210 by wires 250 or the like to seal the light emitting element by a sealing member 230. It should be noted that reference numerals 120 and 110 in the figure correspond to the layer 20 in the light emitting element and the substrate. Further, light emitting device is sealed by a translucent sealing member 230 which seals together with the light emitting device, or by hermetic sealing or the like. In the case of air tight sealing, the translucent member may be configured only with the protective film. The example of FIG. 13B is structured such that the sealing member 230 also serves as a substrate material of the device. A transparent resin, glass and the like having excellent weather-resistance such as an epoxy resin, a silicone resin, and a fluorocarbon resin may be used as a sealing member and a covered member. A material such as a solder such as a eutectic solder, a eutectic material, and an Ag paste may be used as the adhesion member 180 other than such resin materials.

Further, a reflection layer 70 may be provided as a metalized layer on a face opposed to the semiconductor structure on the substrate. The reflectivity of the light tends to increase by arranging the reflecting layer at the back surface of the substrate, and preferably, a light emitting element in which the second main surface of the substrate is exposed may be achieved. The adherence member may adopt a mode of being arranged as a substrate side adherence layer on a metalized layer of the substrate.

Various emission colors can be obtained by providing a light converting member, which is capable of converting at least a part of light from the light emitting element, in the sealing member 230, covered member covering a light emitting elements, translucent member or the like, which is provided on a light path between the light emitting element and the light outputting portion such as the emission portion 223 in FIG. 13 of the light emitting device 200. Examples of the light converting member include a aluminate fluorescent material such as a YAG fluorescent material which is suitably used for white light emission by combining a blue LED, a nitride fluorescent material or a silicate fluorescent material converting light in near-ultraviolet to visible light to light in yellow to red region, or the like. Especially, for a high luminance, longtime operation, a fluorescent material having a garnet structure such as TAG and TAG, for example, $(Re_{1-x}Sm_x)_3(Al_{1-y}Ga_y)_5O_{12}$:Ce ($0 \leq x \leq 1$, $0 \leq y \leq 1$, where Re represents at least one element selected from the group consisting of Y, Gd, La and Tb) and the like are preferably used. Examples of the nitride-based fluorescent material and the oxynitride-based fluorescent material include Sr—Ca—Si—N:Eu, Ca—Si—N:Eu, Sr—Si—N:Eu, Sr—Ca—Si—O—N:Eu, Ca—Si—O—N:Eu, Sr—Si—O—N:Eu or the like, and represented by a general formula $L_xSi_yN_{(2/3X+4/3Y)}$:Eu or $L_xSi_yO_zN_{(2/3X+4/3Y-2/3Z)}$:Eu (where L is one selected from among Sr, Ca, Sr, and Ca). A light emitting device having desired emission color can be obtained by suitably using the fluorescent material described above or other fluorescent materials.

The semiconductor light emitting element of the present invention is suitably used in display, optical communication, light emitting diode for emitting ultraviolet light or red light optimum as a light source of OA equipment, semiconductor device that exits electromagnetic wave having a wavelength region other than the above, and display, illumination etc. using the same.

We claim:

1. A semiconductor light emitting element comprising:
   a first conductive type semiconductor layer;
   a second conductive type semiconductor layer;
   a first electrode being arranged on the first conductive type semiconductor layer;
   a second electrode being arranged on the second conductive type semiconductor layer; and
   a light transmissive insulating film being positioned to overlap at least a part of the first electrode or the second electrode,
   wherein at least the first electrode or the second electrode includes both a first layer and a second layer, the first layer and the second layer being laminated in this order from the first conductive type semiconductor layer side or from the second conductive type semiconductor layer side,
   the second layer comprises an external connecting part and an electrode elongated part which extends from the external connecting part, and
   the light transmissive insulating film has the similar shape as the second layer, in a plan view of the semiconductor light emitting element.

2. The semiconductor light emitting element according to claim 1,
   wherein the light transmissive insulating film is located along the electrode elongated part of the second layer, in a plan view of the semiconductor light emitting element.

3. The semiconductor light emitting element according to claim 2,
   wherein an arrangement of at least the external connecting part or the electrode elongated part is inside an area where the light transmissive insulating film is located, in a plan view of the semiconductor light emitting element.

4. The semiconductor light emitting element according to claim 2,
   wherein an arrangement of a part of at least the external connecting part or the electrode elongated part is out of an area where the light transmissive insulating film is located, in a plan view of the semiconductor light emitting element.

5. The semiconductor light emitting element according to claim 4,
   wherein the first layer and the second layer are laminated outside the light transmissive insulating film.

6. The semiconductor light emitting element according to claim 1,
   a width of the electrode elongated part is formed to be narrower than a width of the light transmissive insulating film, in a plan view of the semiconductor light emitting element.

7. The semiconductor light emitting element according to claim 1,
   wherein the first electrode and the external connecting part of the second electrode are arranged diagonally, in a plan view of the semiconductor light emitting element.

8. The semiconductor light emitting element according to claim 1,
   wherein the first conductive type semiconductor layer is an n-type layer, and the second conductive type semiconductor layer is a p-type layer, respectively.

9. The semiconductor light emitting element according to claim 1,
   further comprising a substrate on which the semiconductor structure is deposited thereon,
   wherein a recess/protrusion structure is formed between the semiconductor structure and the substrate.

10. The semiconductor light emitting element according to claim 1,
wherein the light transmissive insulating film is positioned between the second conductive type semiconductor layer and the second layer of the second electrode, in a cross sectional view of the semiconductor light emitting element.

11. The semiconductor light emitting element according to claim 1,
wherein a thickness of the first layer is smaller than a thickness of the light transmissive insulating film, in a cross sectional view of the semiconductor light emitting element.

12. The semiconductor light emitting element according to claim 1,
wherein the first layer includes Indium Tin Oxide.

13. The semiconductor light emitting element according to claim 1,
wherein the second layer includes Au.

14. A semiconductor light emitting element comprising:
a first conductive type semiconductor layer;
a second conductive type semiconductor layer;
a first electrode being arranged on the first conductive type semiconductor layer;
a second electrode being arranged on the second conductive type semiconductor layer; and
a light transmissive insulating film being positioned to overlap at least a part of the first electrode or the second electrode,
wherein, the light transmissive insulating film has a larger film thickness at an inner area than a film thickness at a perimeter area, in a cross sectional view of the semiconductor light emitting element,
at least the first electrode or the second electrode includes both a first layer and a second layer, the first layer and the second layer being laminated in this order from the first conductive type semiconductor layer or from the second conductive type semiconductor layer,
the second layer comprises an external connecting part, and
the external connecting part is positioned to overlap at least a part of the light transmissive insulating film in a plan view of the semiconductor light emitting element.

15. The semiconductor light emitting element according to claim 14,
wherein the first electrode and the second electrode are arranged on a same plane side of the semiconductor structure, in a plan view of the semiconductor light emitting element.

16. The semiconductor light emitting element according to claim 14,
wherein the first conductive type semiconductor layer is an n-type layer, and the second conductive type semiconductor layer is a p-type layer, respectively.

* * * * *